US012650952B2

(12) United States Patent
Hicks et al.

(10) Patent No.: US 12,650,952 B2
(45) Date of Patent: Jun. 9, 2026

(54) ADJUSTING FILES FOR HUMAN READABLE PRIME NUMBER COMPRESSION (HRPNC) ACCELERATION

(71) Applicant: INTERNATIONAL BUSINESS MACHINES CORPORATION, Armonk, NY (US)

(72) Inventors: Andrew C.M. Hicks, Highland, NY (US); John S. Werner, Fishkill, NY (US); Pasquale A. Catalano, Wallkill, NY (US); Arkadiy O. Tsfasman, Wappingers Falls, NY (US); Ryan Thomas Rawlins, Poughkeepsie, NY (US); Christopher V. Derobertis, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 18/678,081

(22) Filed: May 30, 2024

(65) Prior Publication Data

US 2025/0370960 A1      Dec. 4, 2025

(51) Int. Cl.
*G06F 16/16*      (2019.01)
*H03M 7/30*      (2006.01)

(52) U.S. Cl.
CPC .............. *G06F 16/16* (2019.01); *H03M 7/55* (2013.01)

(58) Field of Classification Search
CPC ............ H03M 7/30; H03M 7/55; G06F 16/16
See application file for complete search history.

(56) References Cited

U.S. PATENT DOCUMENTS

| | | | |
|---|---|---|---|
| 5,790,599 | A | 8/1998 | Wright et al. |
| 6,262,727 | B1 | 7/2001 | Lentz et al. |
| 6,373,986 | B1 | 4/2002 | Fink |
| 6,462,680 | B1 | 10/2002 | Hayes |
| 8,977,664 | B2 | 3/2015 | Maurer |
| 8,977,859 | B2 | 3/2015 | Ross |
| 9,614,543 | B2 | 4/2017 | Dickie |
| 10,725,990 | B2 | 7/2020 | Meyer |
| 11,283,464 | B2 | 3/2022 | Tamir et al. |
| 11,394,749 | B2 | 7/2022 | Buck |
| 11,687,241 | B2 | 6/2023 | Cooper et al. |
| 2007/0168364 | A1* | 7/2007 | Douceur ............... G06F 16/164 |
| 2011/0040735 | A1* | 2/2011 | Lee ..................... G06F 16/1744 707/693 |
| 2014/0009314 | A1* | 1/2014 | Bain ................. G06F 16/90344 341/51 |
| 2016/0342462 | A1 | 11/2016 | Karamanolis et al. |

(Continued)

OTHER PUBLICATIONS

Hicks et al., Conversion Tables as a Service for Human Readable Prime Number Compression (HRPNC), International Business Machines Corporation (IBM), U.S. Appl. No. 18/678,734, filed May 30, 2024, 94 pages.

(Continued)

*Primary Examiner* — Lam T Mai
(74) *Attorney, Agent, or Firm* — Onyx IP Group

(57) ABSTRACT

Adjusting files for human readable prime number compression (HRPNC) acceleration, including: generating a plurality of variants of a binary object; performing HRPNC of each variant of the binary object; identifying a first HRPNC to complete; and providing a compressed variant of the first HRPNC to complete.

20 Claims, 29 Drawing Sheets

(56)  References Cited

U.S. PATENT DOCUMENTS

| | | |
|---|---|---|
| 2016/0342814 A1 | 11/2016 | Wang et al. |
| 2017/0262350 A1 | 9/2017 | Dornemann |
| 2017/0364332 A1* | 12/2017 | Lowell ................ G06F 11/1494 |
| 2018/0309815 A1 | 10/2018 | Dangi et al. |
| 2020/0044664 A1 | 2/2020 | Fannes et al. |
| 2020/0233671 A1* | 7/2020 | Liu ................... G06F 16/90339 |
| 2021/0311835 A1 | 10/2021 | Futey et al. |
| 2022/0027492 A1 | 1/2022 | Wright et al. |
| 2023/0006691 A1 | 1/2023 | Sloane |
| 2023/0088886 A1 | 3/2023 | Tian et al. |
| 2023/0188162 A1 | 6/2023 | Ramadhane et al. |
| 2023/0229401 A1 | 7/2023 | Lyden |
| 2024/0296031 A1* | 9/2024 | Schaffer ................... G06F 8/36 |
| 2025/0240166 A1 | 7/2025 | Derek |

OTHER PUBLICATIONS

Hicks et al., Decompressing Human Readable Prime Number Compression (HRPNC) Objects Using Metadata, International Business Machines Corporation (IBM), U.S. Appl. No. 18/678,893, filed May 30, 2024, 95 pages.

Hicks et al., Enforced Checksums for Human Readable Prime Number Compression (HRPNC), International Business Machines Corporation (IBM), U.S. Appl. No. 18/678,360, filed May 30, 2024, 94 pages.

Hicks et al., Generating Human Readable Prime Number Compression (HRPNC) Metadata for Usage Requirements, International Business Machines Corporation (IBM), U.S. Appl. No. 18/679,076, filed May 30, 2024, 93 pages.

Hicks et al., Human Readable Prime Number Compression (HRPNC) for Binary Variations, International Business Machines Corporation (IBM), U.S. Appl. No. 18/678,153, filed May 30, 2024, 96 pages.

Hicks et al., Human Readable Prime Number Compression (HRPNC), International Business Machines Corporation (IBM), U.S. Appl. No. 18/678,001, filed May 30, 2024, 98 pages.

Hicks et al., Pattern Matching for Human Readable Prime Number Compression (HRPNC), International Business Machines Corporation (IBM), U.S. Appl. No. 18/678,239, filed May 30, 2024, 96 pages.

Hicks et al., Salting Binaries for Human Readable Prime Number Compression (HRPNC), International Business Machines Corporation (IBM), U.S. Appl. No. 18/678,631, filed May 30, 2024, 94 pages.

Appendix P; List of IBM Patent or Applications Treated as Related, Feb. 11, 2025, 2 pages.

* cited by examiner

100

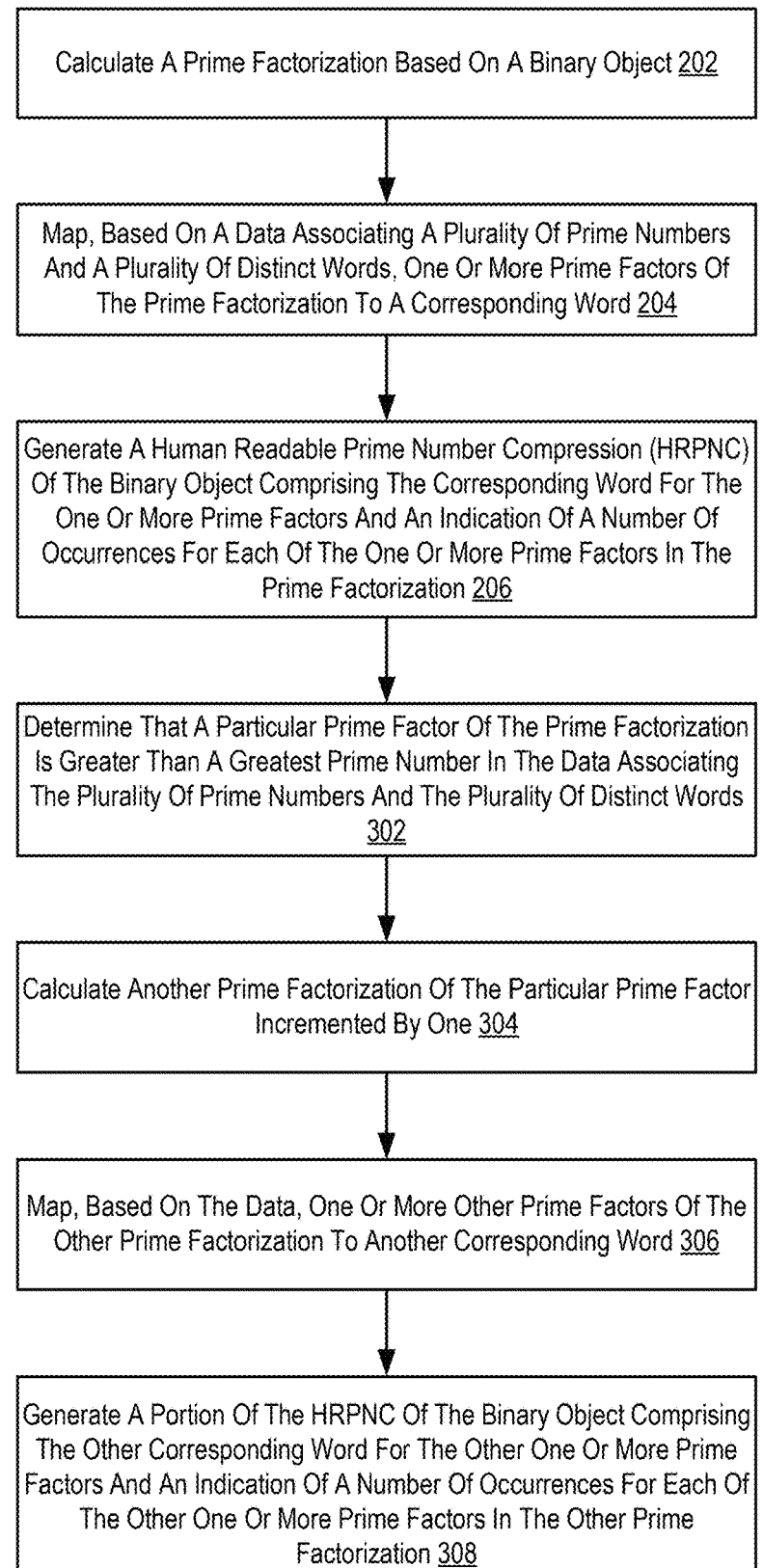

Calculate A Prime Factorization Based On A Binary Object 202

Map, Based On A Data Associating A Plurality Of Prime Numbers And A Plurality Of Distinct Words, One Or More Prime Factors Of The Prime Factorization To A Corresponding Word 204

Generate A Human Readable Prime Number Compression (HRPNC) Of The Binary Object Comprising The Corresponding Word For The One Or More Prime Factors And An Indication Of A Number Of Occurrences For Each Of The One Or More Prime Factors In The Prime Factorization 206

Determine That A Particular Prime Factor Of The Prime Factorization Is Greater Than A Greatest Prime Number In The Data Associating The Plurality Of Prime Numbers And The Plurality Of Distinct Words 302

Calculate Another Prime Factorization Of The Particular Prime Factor Incremented By One 304

Map, Based On The Data, One Or More Other Prime Factors Of The Other Prime Factorization To Another Corresponding Word 306

Generate A Portion Of The HRPNC Of The Binary Object Comprising The Other Corresponding Word For The Other One Or More Prime Factors And An Indication Of A Number Of Occurrences For Each Of The Other One Or More Prime Factors In The Other Prime Factorization 308

FIG. 3

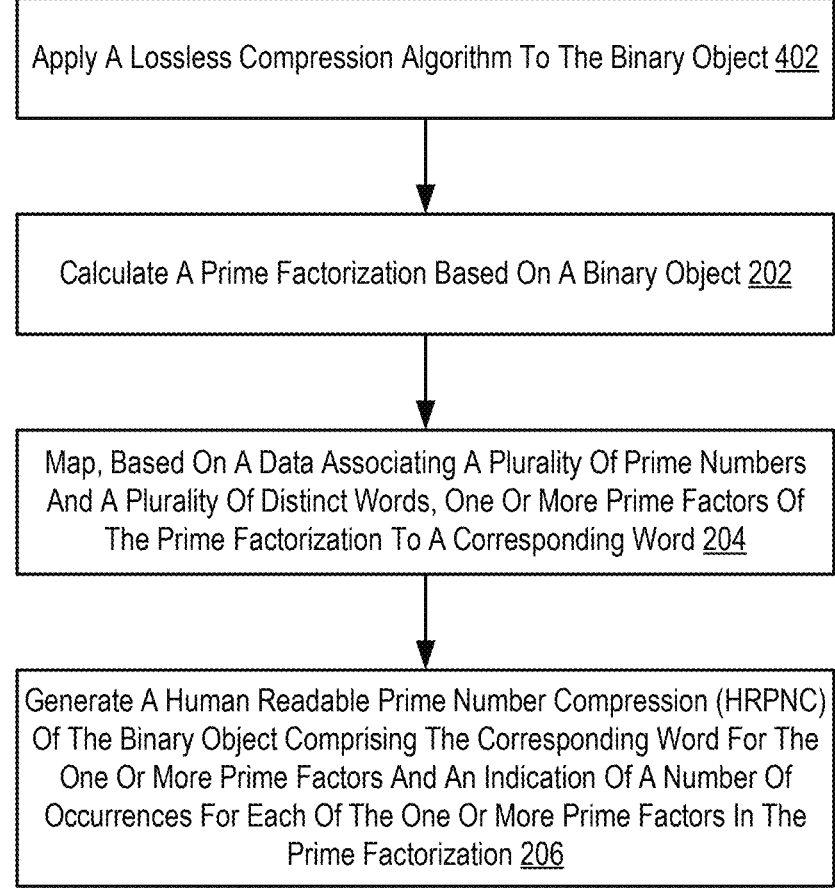

Apply A Lossless Compression Algorithm To The Binary Object 402

Calculate A Prime Factorization Based On A Binary Object 202

Map, Based On A Data Associating A Plurality Of Prime Numbers And A Plurality Of Distinct Words, One Or More Prime Factors Of The Prime Factorization To A Corresponding Word 204

Generate A Human Readable Prime Number Compression (HRPNC) Of The Binary Object Comprising The Corresponding Word For The One Or More Prime Factors And An Indication Of A Number Of Occurrences For Each Of The One Or More Prime Factors In The Prime Factorization 206

FIG. 4

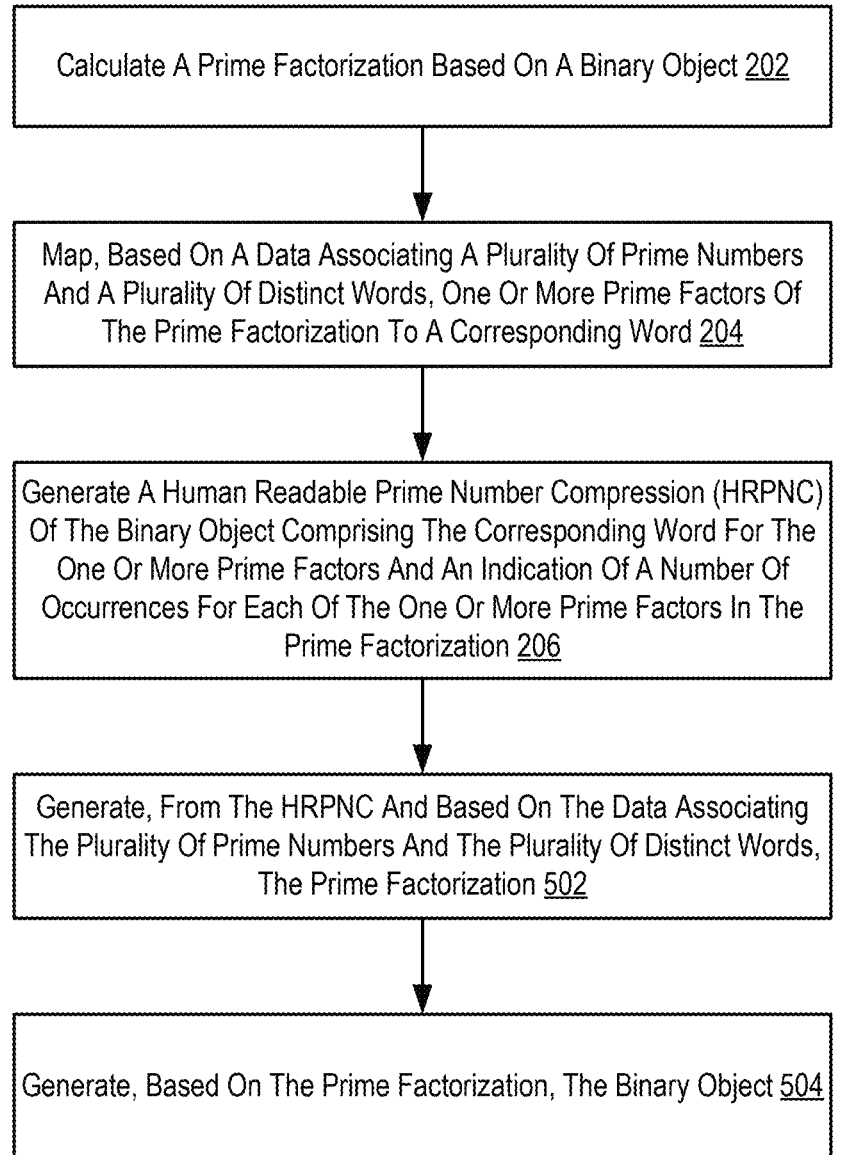

Calculate A Prime Factorization Based On A Binary Object 202

Map, Based On A Data Associating A Plurality Of Prime Numbers And A Plurality Of Distinct Words, One Or More Prime Factors Of The Prime Factorization To A Corresponding Word 204

Generate A Human Readable Prime Number Compression (HRPNC) Of The Binary Object Comprising The Corresponding Word For The One Or More Prime Factors And An Indication Of A Number Of Occurrences For Each Of The One Or More Prime Factors In The Prime Factorization 206

Generate, From The HRPNC And Based On The Data Associating The Plurality Of Prime Numbers And The Plurality Of Distinct Words, The Prime Factorization 502

Generate, Based On The Prime Factorization, The Binary Object 504

FIG. 5

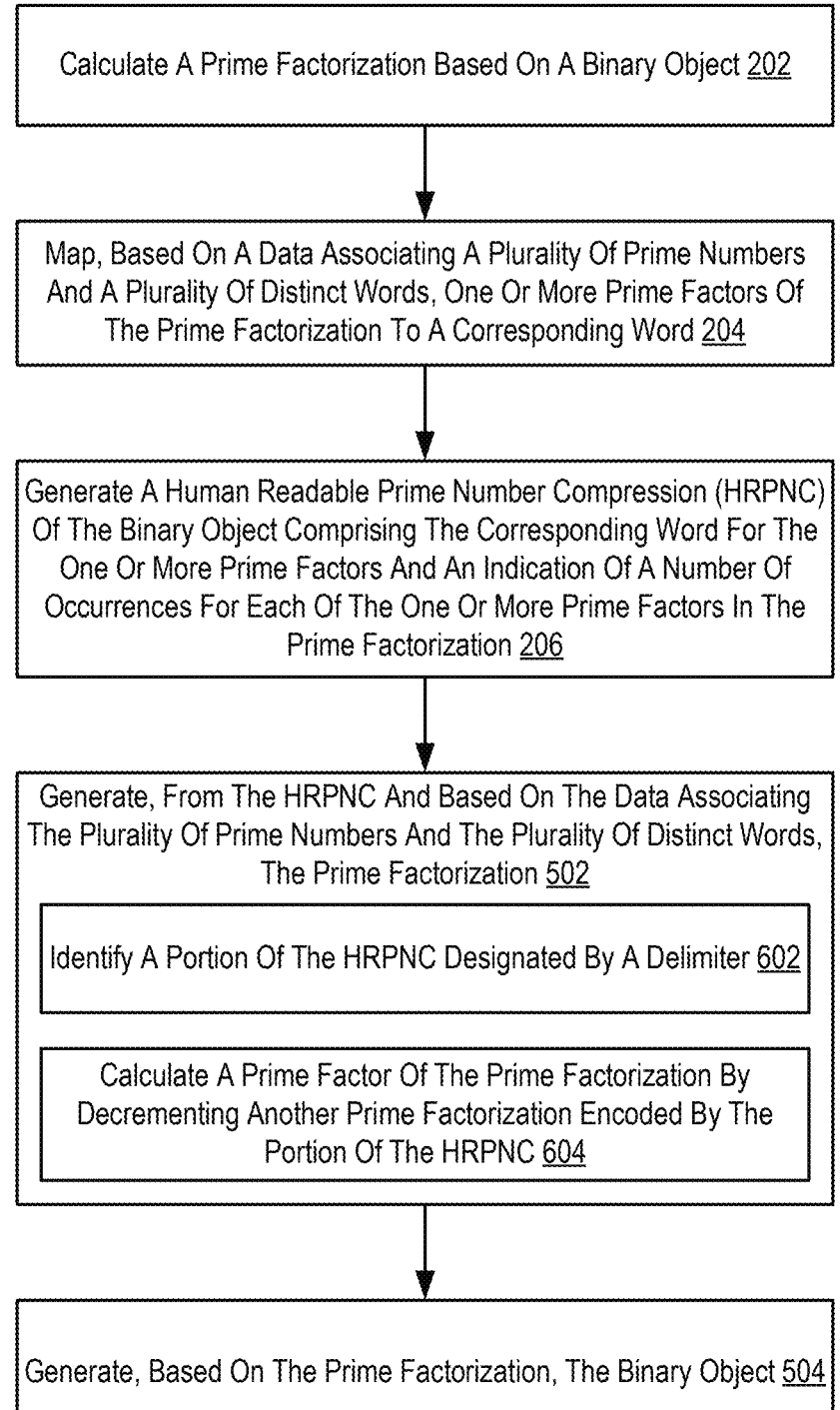

Calculate A Prime Factorization Based On A Binary Object 202

Map, Based On A Data Associating A Plurality Of Prime Numbers And A Plurality Of Distinct Words, One Or More Prime Factors Of The Prime Factorization To A Corresponding Word 204

Generate A Human Readable Prime Number Compression (HRPNC) Of The Binary Object Comprising The Corresponding Word For The One Or More Prime Factors And An Indication Of A Number Of Occurrences For Each Of The One Or More Prime Factors In The Prime Factorization 206

Generate, From The HRPNC And Based On The Data Associating The Plurality Of Prime Numbers And The Plurality Of Distinct Words, The Prime Factorization 502

Identify A Portion Of The HRPNC Designated By A Delimiter 602

Calculate A Prime Factor Of The Prime Factorization By Decrementing Another Prime Factorization Encoded By The Portion Of The HRPNC 604

Generate, Based On The Prime Factorization, The Binary Object 504

FIG. 6

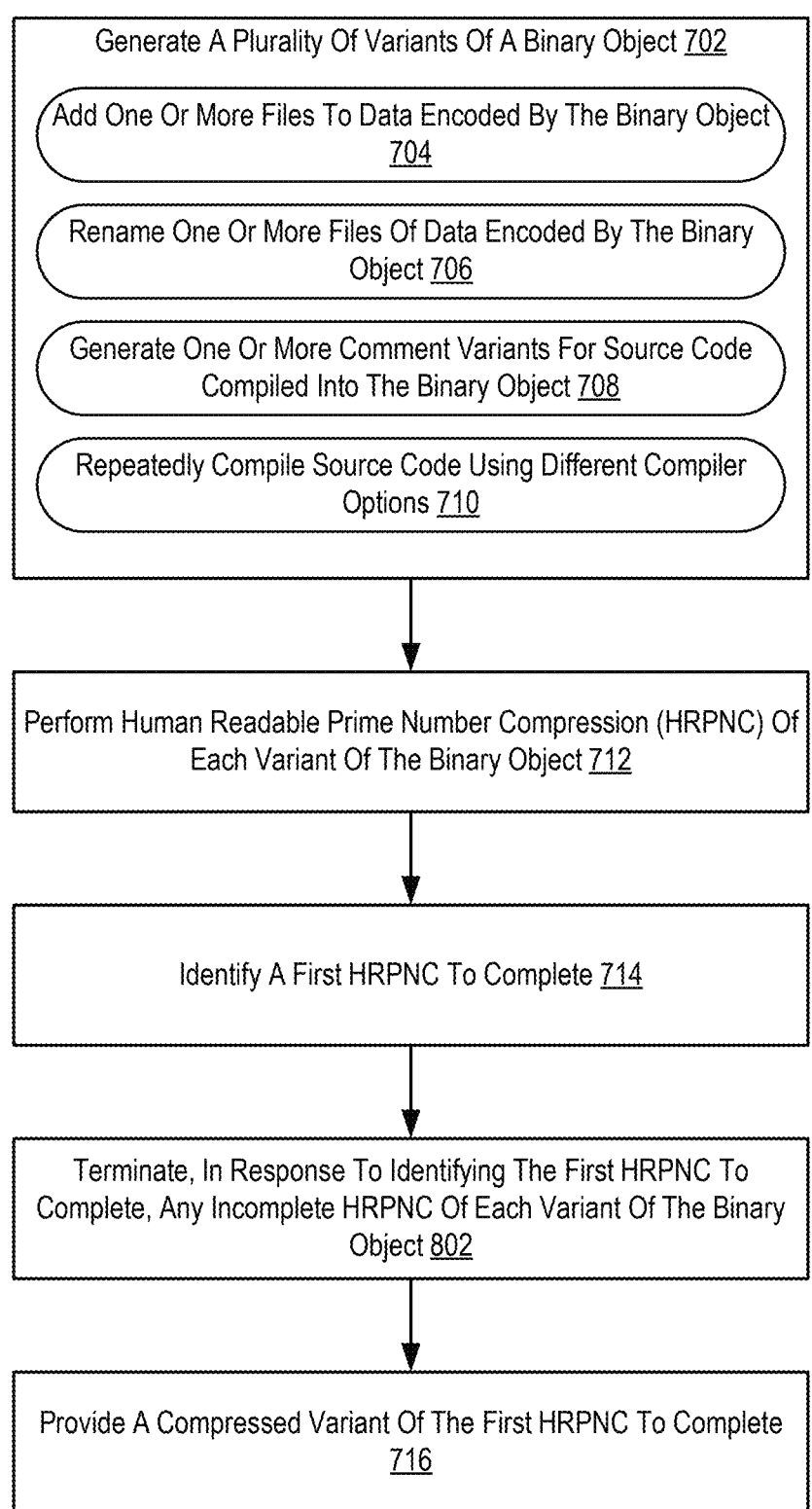

Generate A Plurality Of Variants Of A Binary Object 702

Add One Or More Files To Data Encoded By The Binary Object 704

Rename One Or More Files Of Data Encoded By The Binary Object 706

Generate One Or More Comment Variants For Source Code Compiled Into The Binary Object 708

Repeatedly Compile Source Code Using Different Compiler Options 710

Perform Human Readable Prime Number Compression (HRPNC) Of Each Variant Of The Binary Object 712

Identify A First HRPNC To Complete 714

Terminate, In Response To Identifying The First HRPNC To Complete, Any Incomplete HRPNC Of Each Variant Of The Binary Object 802

Provide A Compressed Variant Of The First HRPNC To Complete 716

FIG. 8

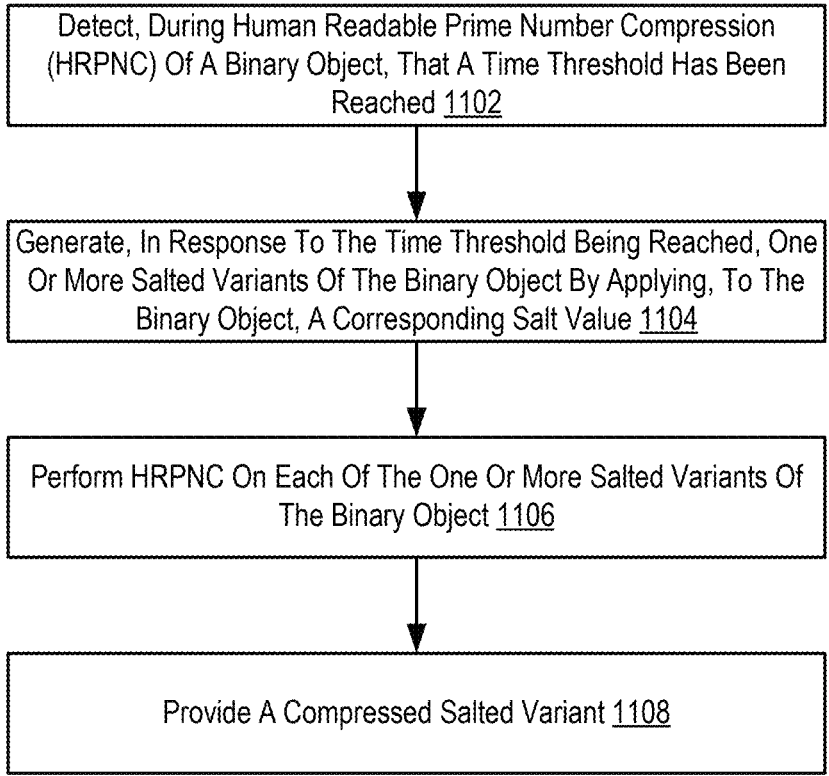

Detect, During Human Readable Prime Number Compression (HRPNC) Of A Binary Object, That A Time Threshold Has Been Reached 1102

Generate, In Response To The Time Threshold Being Reached, One Or More Salted Variants Of The Binary Object By Applying, To The Binary Object, A Corresponding Salt Value 1104

Perform HRPNC On Each Of The One Or More Salted Variants Of The Binary Object 1106

Provide A Compressed Salted Variant 1108

FIG. 11

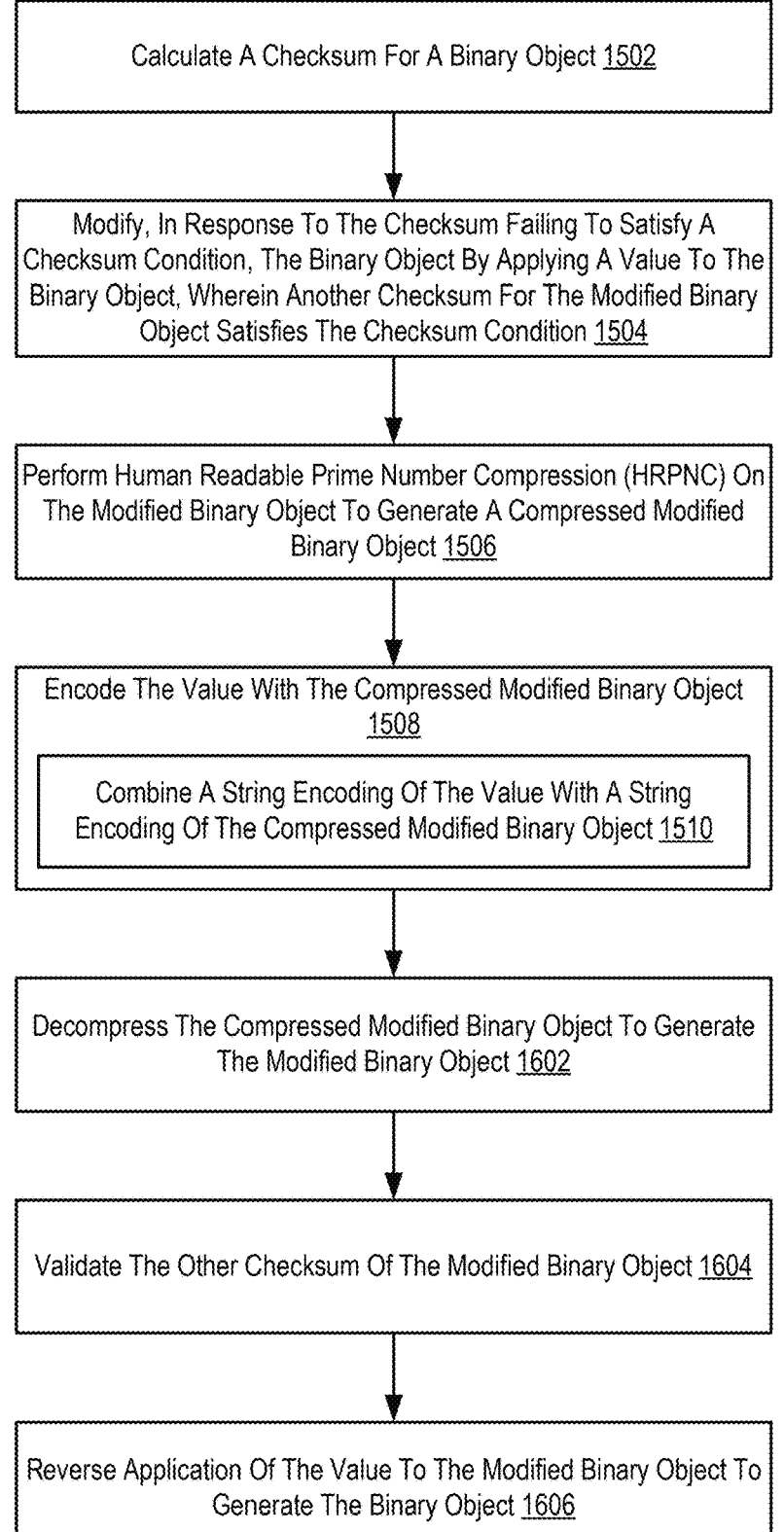

Calculate A Checksum For A Binary Object 1502

Modify, In Response To The Checksum Failing To Satisfy A Checksum Condition, The Binary Object By Applying A Value To The Binary Object, Wherein Another Checksum For The Modified Binary Object Satisfies The Checksum Condition 1504

Perform Human Readable Prime Number Compression (HRPNC) On The Modified Binary Object To Generate A Compressed Modified Binary Object 1506

Encode The Value With The Compressed Modified Binary Object 1508

Combine A String Encoding Of The Value With A String Encoding Of The Compressed Modified Binary Object 1510

Decompress The Compressed Modified Binary Object To Generate The Modified Binary Object 1602

Validate The Other Checksum Of The Modified Binary Object 1604

Reverse Application Of The Value To The Modified Binary Object To Generate The Binary Object 1606

FIG. 16

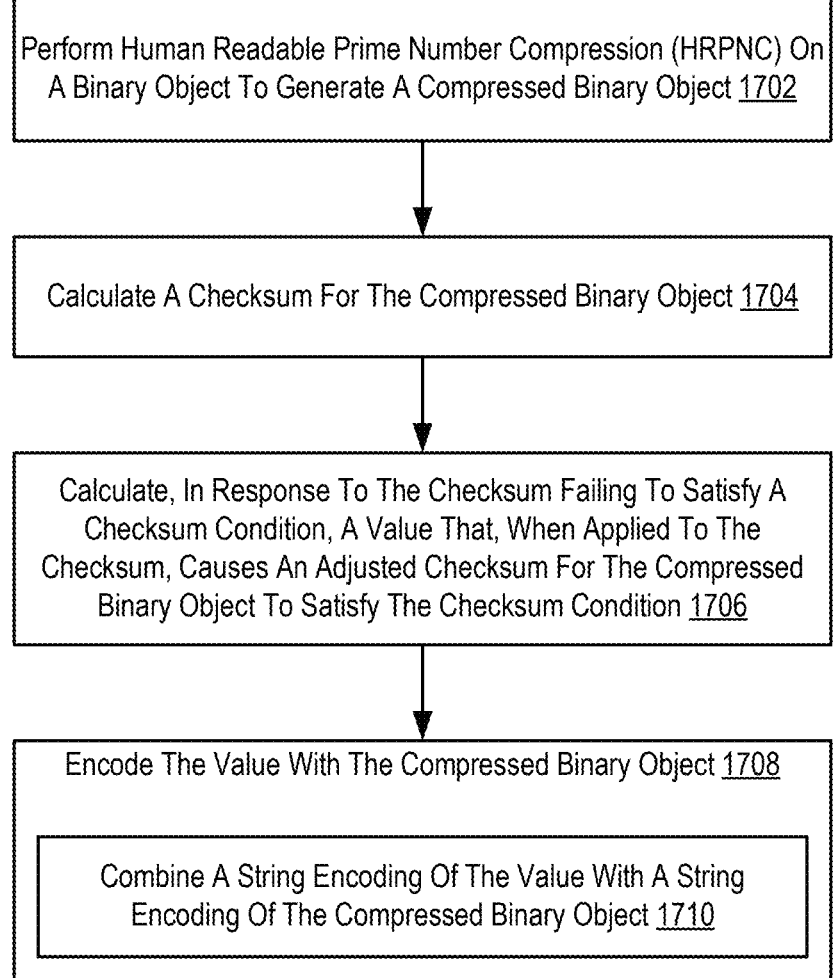

Perform Human Readable Prime Number Compression (HRPNC) On A Binary Object To Generate A Compressed Binary Object 1702

Calculate A Checksum For The Compressed Binary Object 1704

Calculate, In Response To The Checksum Failing To Satisfy A Checksum Condition, A Value That, When Applied To The Checksum, Causes An Adjusted Checksum For The Compressed Binary Object To Satisfy The Checksum Condition 1706

Encode The Value With The Compressed Binary Object 1708

Combine A String Encoding Of The Value With A String Encoding Of The Compressed Binary Object 1710

FIG. 17

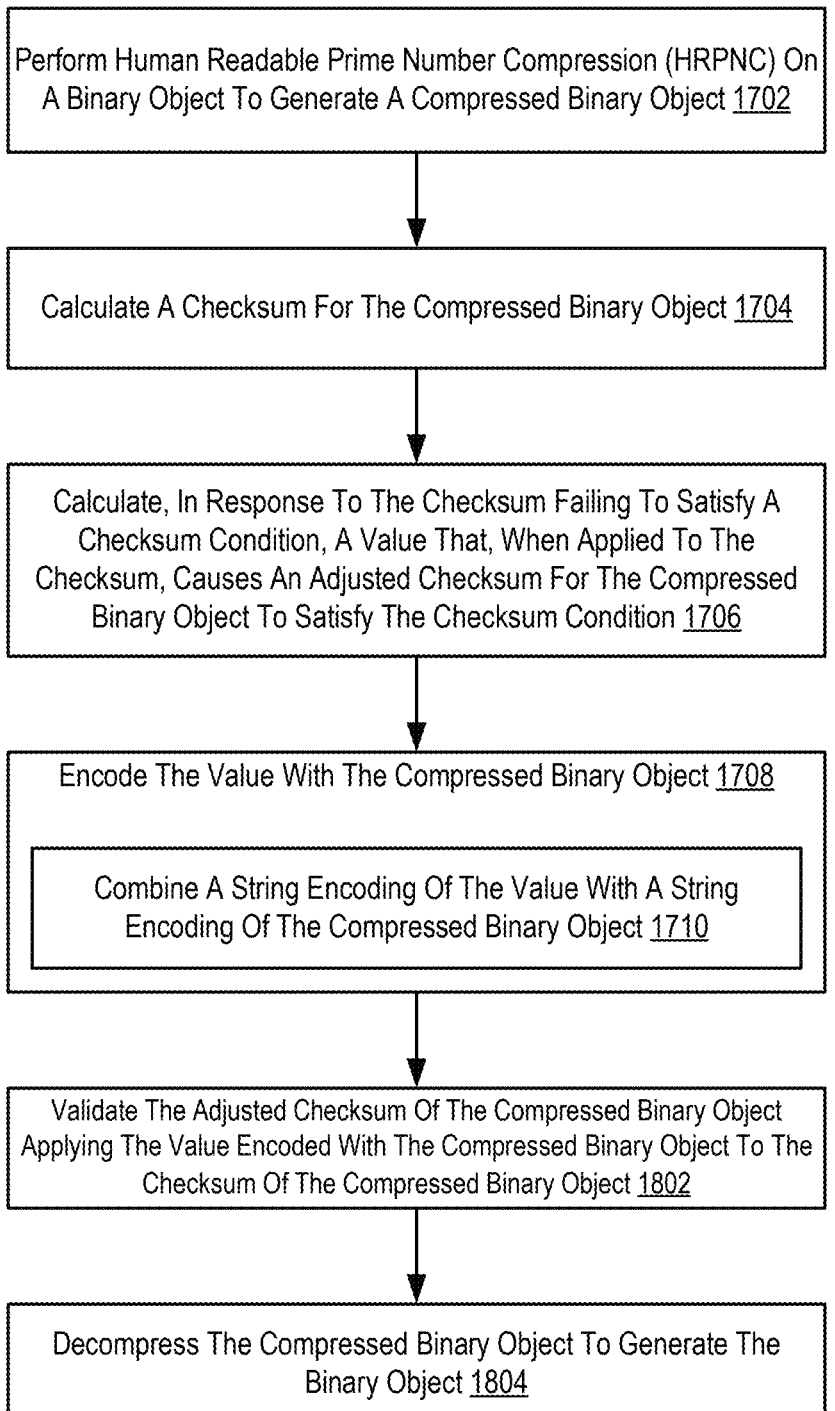

Perform Human Readable Prime Number Compression (HRPNC) On A Binary Object To Generate A Compressed Binary Object 1702

Calculate A Checksum For The Compressed Binary Object 1704

Calculate, In Response To The Checksum Failing To Satisfy A Checksum Condition, A Value That, When Applied To The Checksum, Causes An Adjusted Checksum For The Compressed Binary Object To Satisfy The Checksum Condition 1706

Encode The Value With The Compressed Binary Object 1708

Combine A String Encoding Of The Value With A String Encoding Of The Compressed Binary Object 1710

Validate The Adjusted Checksum Of The Compressed Binary Object Applying The Value Encoded With The Compressed Binary Object To The Checksum Of The Compressed Binary Object 1802

Decompress The Compressed Binary Object To Generate The Binary Object 1804

FIG. 18

Receive A Table Mapping A Plurality Of Prime Numbers To A Plurality Of Distinct Words 1902

Perform, Based On The Table, Human Readable Prime Number Compression (HRPNC) Of A Binary Object To Generate A Compressed Binary Object 1904

Encode, With The Compressed Binary Object, A Table Identifier For The Table 1906

Provide A Request For The Selection Of The Table 2002

Receive A Table Mapping A Plurality Of Prime Numbers To A Plurality Of Distinct Words 1902

Perform, Based On The Table, Human Readable Prime Number Compression (HRPNC) Of A Binary Object To Generate A Compressed Binary Object 1904

Encode, With The Compressed Binary Object, A Table Identifier For The Table 1906

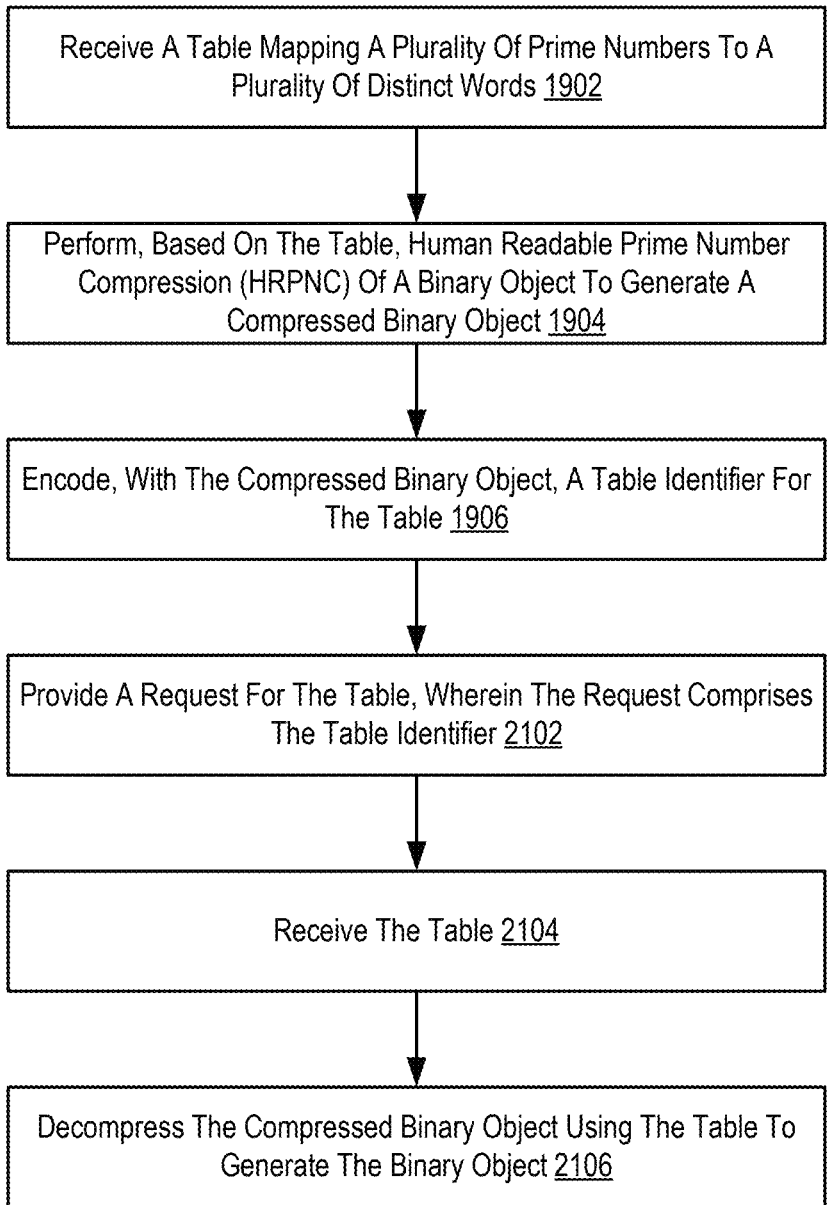

Receive A Table Mapping A Plurality Of Prime Numbers To A Plurality Of Distinct Words 1902

Perform, Based On The Table, Human Readable Prime Number Compression (HRPNC) Of A Binary Object To Generate A Compressed Binary Object 1904

Encode, With The Compressed Binary Object, A Table Identifier For The Table 1906

Provide A Request For The Table, Wherein The Request Comprises The Table Identifier 2102

Receive The Table 2104

Decompress The Compressed Binary Object Using The Table To Generate The Binary Object 2106

FIG. 21

Perform Human Readable Prime Number Compression (HRPNC) Of A Binary Object To Generate A Compressed Binary Object 2202

Generate Metadata Describing One Or More Usage Requirements For The Binary Object 2204

Perform HRPNC On The Metadata To Generate Compressed Metadata 2206

Encode The Compressed Metadata With The Compressed Binary Object 2302

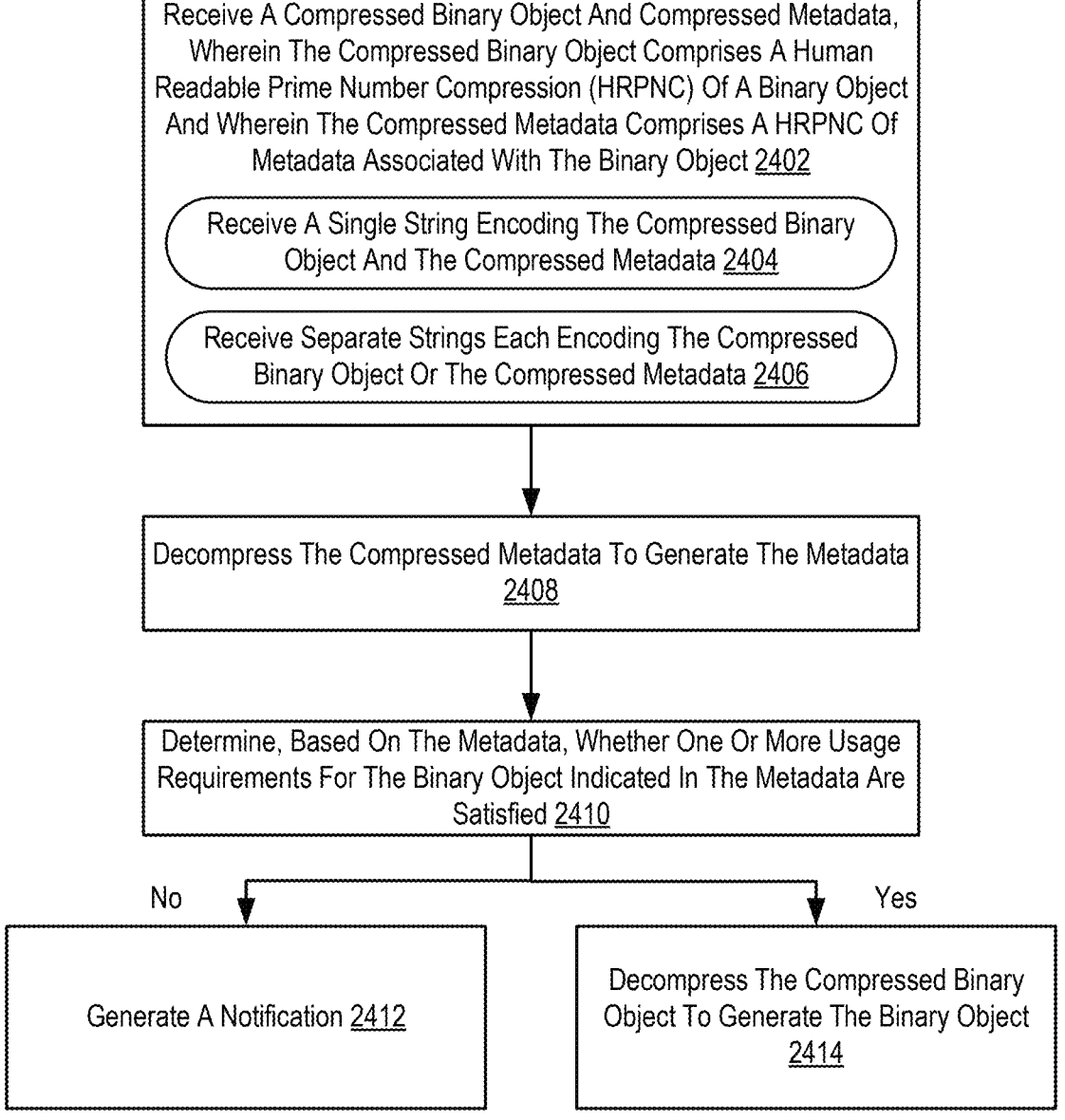

Receive A Compressed Binary Object And Compressed Metadata, Wherein The Compressed Binary Object Comprises A Human Readable Prime Number Compression (HRPNC) Of A Binary Object And Wherein The Compressed Metadata Comprises A HRPNC Of Metadata Associated With The Binary Object 2402

Receive A Single String Encoding The Compressed Binary Object And The Compressed Metadata 2404

Receive Separate Strings Each Encoding The Compressed Binary Object Or The Compressed Metadata 2406

Decompress The Compressed Metadata To Generate The Metadata 2408

Determine, Based On The Metadata, Whether One Or More Usage Requirements For The Binary Object Indicated In The Metadata Are Satisfied 2410

No

Yes

Generate A Notification 2412

Decompress The Compressed Binary Object To Generate The Binary Object 2414

FIG. 24

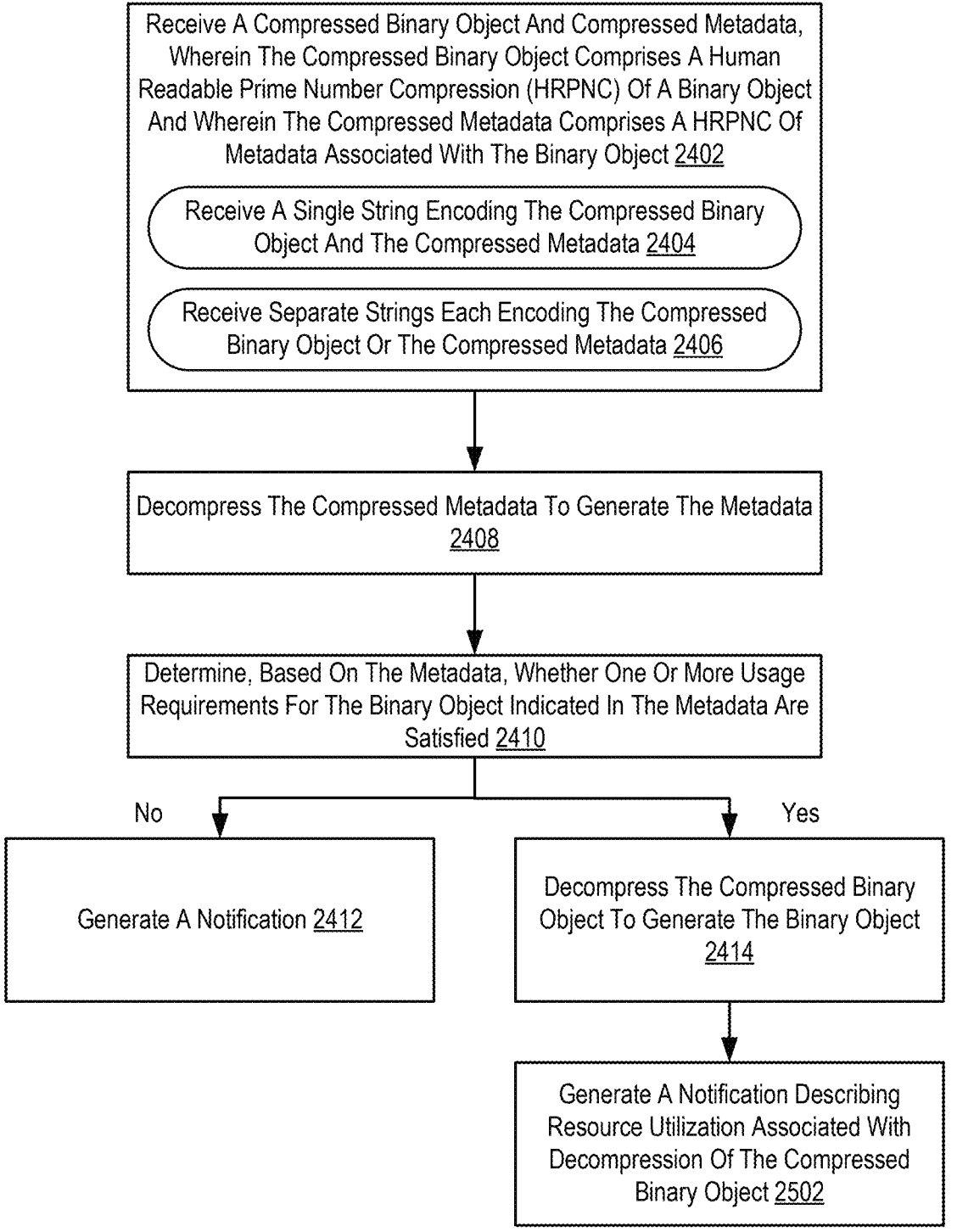

Receive A Compressed Binary Object And Compressed Metadata, Wherein The Compressed Binary Object Comprises A Human Readable Prime Number Compression (HRPNC) Of A Binary Object And Wherein The Compressed Metadata Comprises A HRPNC Of Metadata Associated With The Binary Object 2402

Receive A Single String Encoding The Compressed Binary Object And The Compressed Metadata 2404

Receive Separate Strings Each Encoding The Compressed Binary Object Or The Compressed Metadata 2406

Decompress The Compressed Metadata To Generate The Metadata 2408

Determine, Based On The Metadata, Whether One Or More Usage Requirements For The Binary Object Indicated In The Metadata Are Satisfied 2410

No

Generate A Notification 2412

Yes

Decompress The Compressed Binary Object To Generate The Binary Object 2414

Generate A Notification Describing Resource Utilization Associated With Decompression Of The Compressed Binary Object 2502

FIG. 25

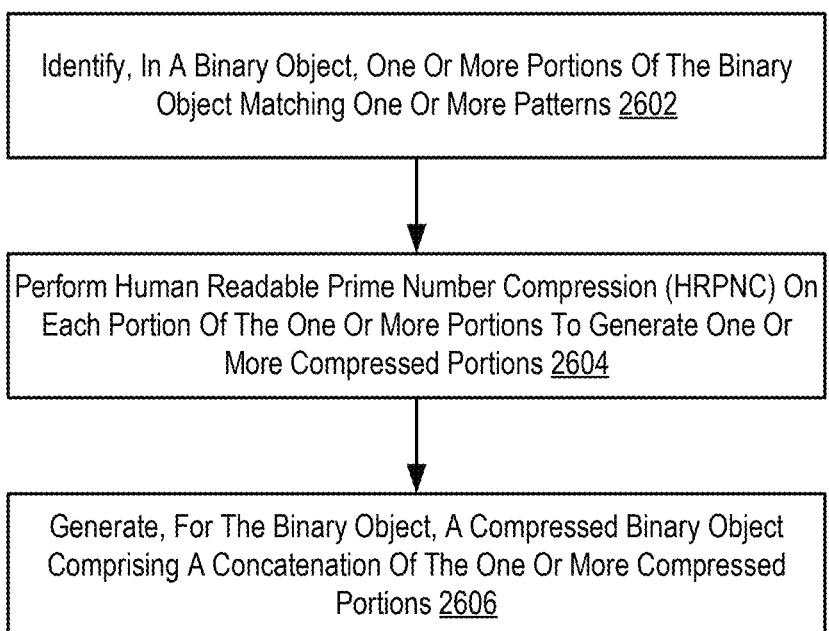

Identify, In A Binary Object, One Or More Portions Of The Binary Object Matching One Or More Patterns 2602

Perform Human Readable Prime Number Compression (HRPNC) On Each Portion Of The One Or More Portions To Generate One Or More Compressed Portions 2604

Generate, For The Binary Object, A Compressed Binary Object Comprising A Concatenation Of The One Or More Compressed Portions 2606

FIG. 26

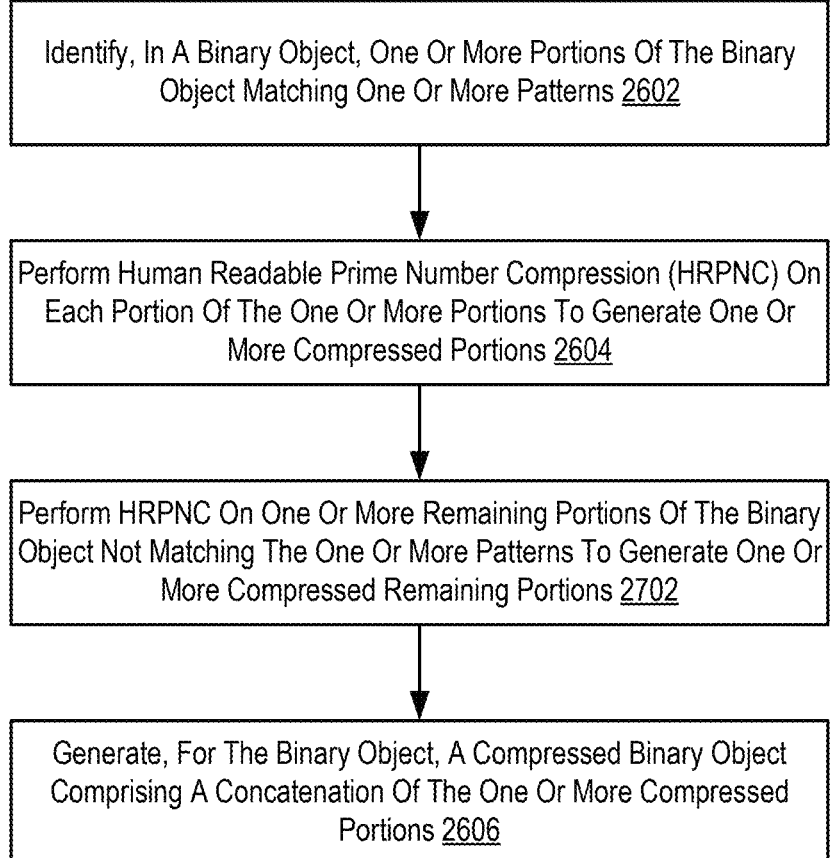

Identify, In A Binary Object, One Or More Portions Of The Binary Object Matching One Or More Patterns 2602

Perform Human Readable Prime Number Compression (HRPNC) On Each Portion Of The One Or More Portions To Generate One Or More Compressed Portions 2604

Perform HRPNC On One Or More Remaining Portions Of The Binary Object Not Matching The One Or More Patterns To Generate One Or More Compressed Remaining Portions 2702

Generate, For The Binary Object, A Compressed Binary Object Comprising A Concatenation Of The One Or More Compressed Portions 2606

FIG. 27

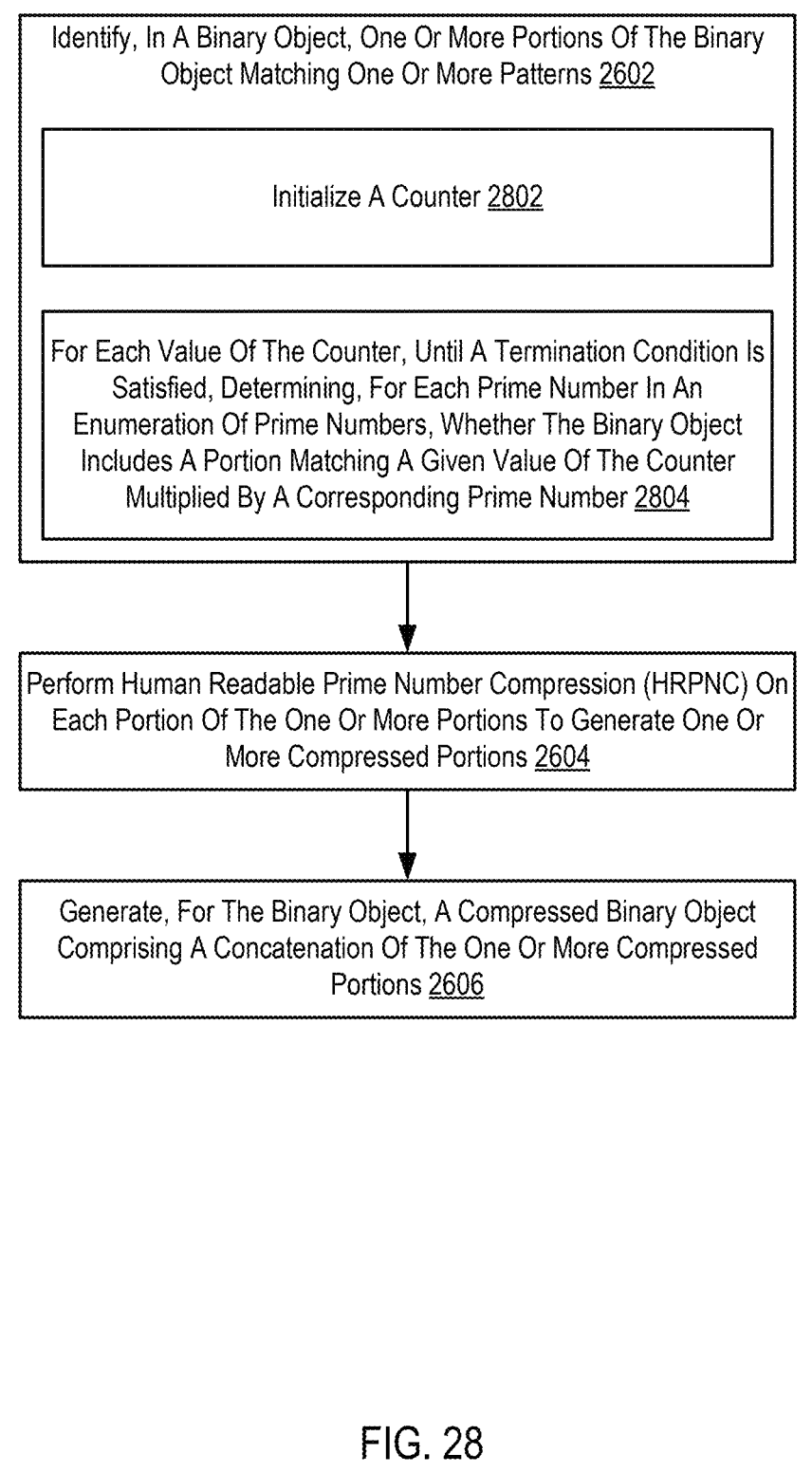

Identify, In A Binary Object, One Or More Portions Of The Binary Object Matching One Or More Patterns 2602

Initialize A Counter 2802

For Each Value Of The Counter, Until A Termination Condition Is Satisfied, Determining, For Each Prime Number In An Enumeration Of Prime Numbers, Whether The Binary Object Includes A Portion Matching A Given Value Of The Counter Multiplied By A Corresponding Prime Number 2804

Perform Human Readable Prime Number Compression (HRPNC) On Each Portion Of The One Or More Portions To Generate One Or More Compressed Portions 2604

Generate, For The Binary Object, A Compressed Binary Object Comprising A Concatenation Of The One Or More Compressed Portions 2606

FIG. 28

ADJUSTING FILES FOR HUMAN READABLE PRIME NUMBER COMPRESSION (HRPNC) ACCELERATION

BACKGROUND

The present disclosure relates to methods, apparatus, and products for adjusting files for human readable prime number compression (HRPNC) acceleration. Some computing systems face particular challenges in sending or receiving data due to their configurations or security considerations. For example, some systems may be air-gapped and not maintain a network connection to external networks to improve security. In order to transfer data to these systems, data may be loaded from physical storage media, or a temporary network connection may be established to a dedicated server from which the data may be loaded. However, these approaches effectively temporarily compromise the air-gapped nature of the system and expose them to various vulnerabilities. It may also be difficult for a user to remember, write, or read and correctly enter a long binary string in an air-gapped environment. As another example, certain remote environments such as in space or underwater may affect the quality of available network connections. Data transferred to these locations may be slow and unstable, increasing the likelihood that large data transfers may fail, result in corrupted data, and the like. Moreover, in these environments, compressing the amount of data transferred may be highly desired.

SUMMARY

According to embodiments of the present disclosure, various methods, apparatus and products for adjusting files for human readable prime number compression (HRPNC) acceleration are described herein. In some aspects, adjusting files for HRPNC acceleration includes generating a plurality of variants of a binary object; performing HRPNC of each variant of the binary object; identifying a first HRPNC to complete; and providing a compressed variant of the first HRPNC to complete. In some aspects, an apparatus may include a processing device; and memory operatively coupled to the processing device, wherein the memory stores computer program instructions that, when executed, cause the processing device to perform this method. In some aspects, a computer program product comprising a computer readable storage medium may store computer program instructions that, when executed, perform this method.

BRIEF DESCRIPTION OF THE DRAWINGS

FIG. 3 sets forth a flowchart of another example method of HRPNC in accordance with some embodiments of the present disclosure.

FIG. 4 sets forth a flowchart of another example method of HRPNC in accordance with some embodiments of the present disclosure.

FIG. 5 sets forth a flowchart of another example method of HRPNC in accordance with some embodiments of the present disclosure.

FIG. 6 sets forth a flowchart of another example method of HRPNC in accordance with some embodiments of the present disclosure.

FIG. 8 sets forth a flowchart of another example method of adjusting files for HRPNC acceleration in accordance with some embodiments of the present disclosure.

FIG. 11 sets forth a flowchart of an example method of salting binaries for HRPNC in accordance with some embodiments of the present disclosure.

FIG. 16 sets forth a flowchart of another example method of enforced checksums for HRPNC in accordance with some embodiments of the present disclosure.

FIG. 17 sets forth a flowchart of another example method of enforced checksums for HRPNC in accordance with some embodiments of the present disclosure.

FIG. 18 sets forth a flowchart of another example method of enforced checksums for HRPNC in accordance with some embodiments of the present disclosure.

FIG. 21 sets forth a flowchart of another example method of conversion tables as a service for HRPNC in accordance with some embodiments of the present disclosure.

FIG. 24 sets forth a flowchart of an example method of decompressing HRPNC objects using metadata in accordance with some embodiments of the present disclosure.

FIG. 25 sets forth a flowchart of another example method of decompressing HRPNC objects using metadata in accordance with some embodiments of the present disclosure.

FIG. 26 sets forth a flowchart of an example method of pattern matching for HRPNC in accordance with some embodiments of the present disclosure.

FIG. 27 sets forth a flowchart of another example method of pattern matching for HRPNC in accordance with some embodiments of the present disclosure.

FIG. 28 sets forth a flowchart of another example method of pattern matching for HRPNC in accordance with some embodiments of the present disclosure.

DETAILED DESCRIPTION

Figure 1:
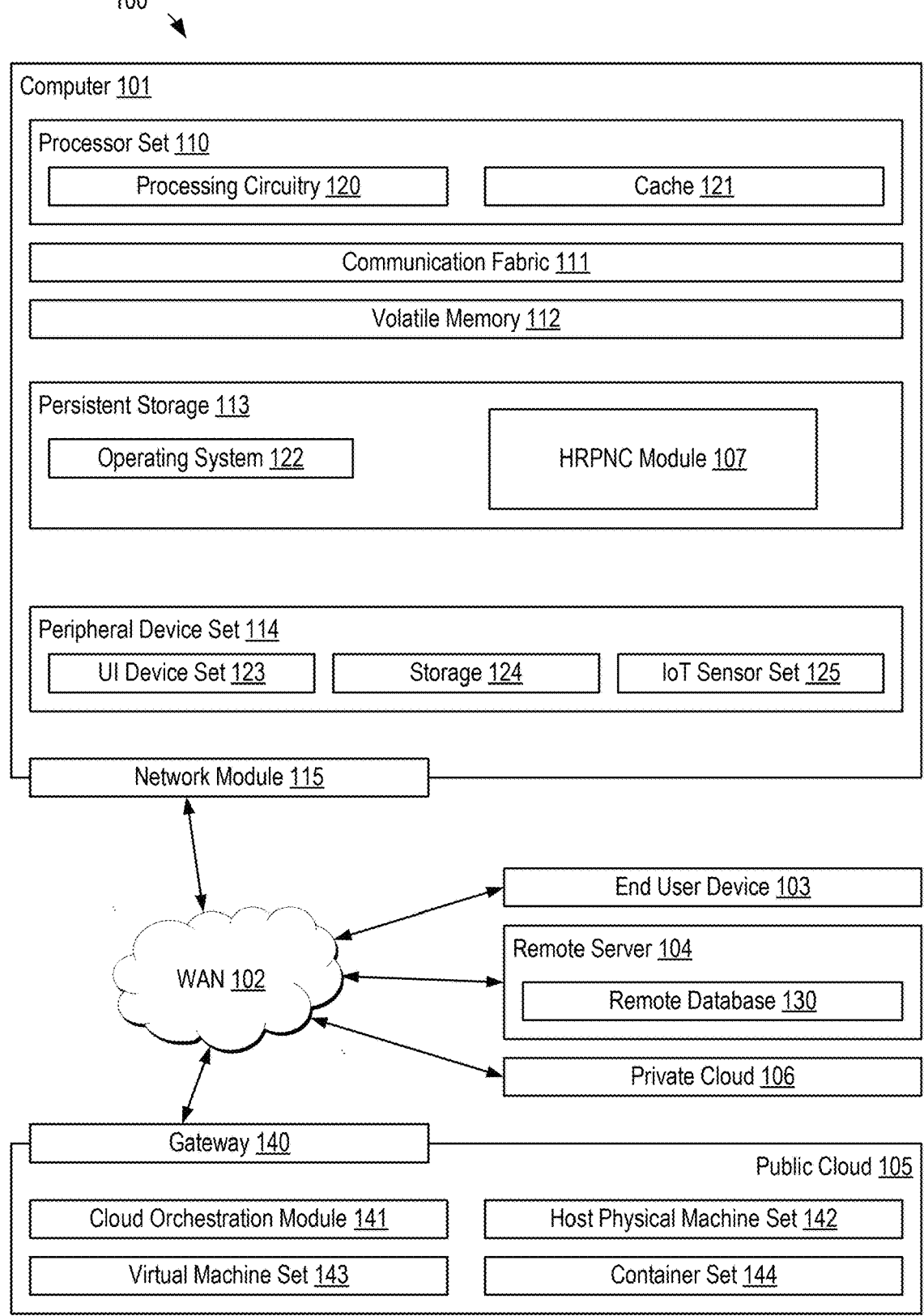
FIG. 1 sets forth a diagram of an example computing environment for human readable prime number compression (HRPNC) in accordance with some embodiments of the present disclosure.

In some aspects, a method for adjusting files for HRPNC acceleration includes: generating a plurality of variants of a binary object; performing HRPNC of each variant of the binary object; identifying a first HRPNC to complete; and providing a compressed variant of the first HRPNC to complete. This provides the advantage of accelerating HRPNC of a binary object by creating variants of the binary object that may compress faster using HRPNC.

In some aspects, this method may include terminating, in response to identifying the first HRPNC to complete, any incomplete HRPNC of each variant of the binary object. This provides the advantage of saving computational resources used in compressing other variants of the binary object.

In some aspects, generating the plurality of variants of the binary object includes adding one or more files to data encoded by the binary object. This provides the advantage of introducing variation without affecting the underlying functionality of the binary object.

In some aspects, generating the plurality of variants of the binary object includes renaming one or more files of data encoded by the binary object. This provides the advantage of introducing variation without affecting the underlying functionality of the binary object.

In some aspects, generating the plurality of variants of the binary object includes generating one or more comment variants for source code encoded by the binary object. This provides the advantage of introducing variation without affecting the underlying functionality of the binary object.

In some aspects, generating the plurality of variants of the binary object includes repeatedly compiling source code using different compiler options. This provides the advantage of introducing variation without affecting the underlying functionality of the binary object.

In some aspects, HRPNC of each variant of the binary object is performed at least partially in parallel. This provides the advantage of improved speed in performing HRPNC for multiple variants.

In some aspects, this method may include generating one or more instructions to undo a variation associated with the compressed variant. This allows for modifications to the binary object introduced when creating a variant to be reversed by a recipient of the compressed variant after decompression.

In some aspects, this method may include generating a notification indicating the first HRPNC to complete. This provides the advantage of informing users as to which variant has completed HRPNC.

In some aspects, generating the plurality of variants is facilitated by at least one generative artificial intelligence (AI) model. This provides the advantage of having the introduced variants reflect human modifications, improving the user experience.

In some aspects, an apparatus for adjusting files for HRPNC acceleration includes: a processing device; and memory operatively coupled to the processing device, wherein the memory stores computer program instructions that, when executed, cause the processing device to: generate a plurality of variants of a binary object; perform human readable prime number compression (HRPNC) of each variant of the binary object; identify a first HRPNC to complete; and provide a compressed variant of the first HRPNC to complete. This provides the advantage of accelerating HRPNC of a binary object by creating variants of the binary object that may compress faster using HRPNC.

In some aspects, the computer program instructions, when executed, further cause the processing device to terminate, in response to identifying the first HRPNC to complete, any incomplete HRPNC of each variant of the binary object. This provides the advantage of saving computational resources used in compressing other variants of the binary object.

In some aspects, to generate the plurality of variants of the binary object, the computer program instructions, when executed, cause the processing device to add one or more files to data encoded by the binary object. This provides the advantage of introducing variation without affecting the underlying functionality of the binary object.

In some aspects, to generate the plurality of variants of the binary object, the computer program instructions, when executed, cause the processing device to rename one or more files of data encoded by the binary object. This provides the advantage of introducing variation without affecting the underlying functionality of the binary object.

In some aspects, to generate the plurality of variants of the binary object, the computer program instructions, when executed, cause the processing device to generate one or more comment variants for source code encoded by the binary object. This provides the advantage of introducing variation without affecting the underlying functionality of the binary object.

In some aspects, to generate the plurality of variants of the binary object, the computer program instructions, when executed, cause the processing device to repeatedly compile source code using different compiler options. This provides the advantage of introducing variation without affecting the underlying functionality of the binary object.

In some aspects, HRPNC of each variant of the binary object is performed at least partially in parallel. This provides the advantage of improved speed in performing HRPNC for multiple variants.

In some aspects, the computer program instructions, when executed, further cause the processing device to generate one or more instructions to undo a variation associated with the compressed variant. This allows for modifications to the binary object introduced when creating a variant to be reversed by a recipient of the compressed variant after decompression.

In some aspects, the computer program instructions, when executed, further cause the processing device to generate a notification indicating the first HRPNC to complete. This provides the advantage of informing users as to which variant has completed HRPNC.

In some aspects, a computer program product for adjusting files for HRPNC acceleration includes: a computer readable storage medium, wherein the computer readable storage medium comprises computer program instructions that, when executed: generate a plurality of variants of a binary object; perform human readable prime number compression (HRPNC) of each variant of the binary object; identify a first HRPNC to complete; and provide a compressed variant of the first HRPNC to complete. This provides the advantage of accelerating HRPNC of a binary object by creating variants of the binary object that may compress faster using HRPNC.

Some computing systems face particular challenges in sending or receiving data due to their configurations or security considerations. For example, some systems may be air-gapped and not maintain a network connection to external networks to improve security. In order to transfer data to these systems, data may be loaded from physical storage media, or a temporary network connection may be established to a dedicated server from which the data may be loaded. However, these approaches effectively temporarily compromise the air-gapped nature of the system and expose them to various vulnerabilities. As another example, certain remote environments such as in space or underwater may affect the quality of available network connections. Data transferred to these locations may be slow and unstable, increasing the likelihood that large data transfers may fail, result in corrupted data, and the like. Accordingly, it may be beneficial to encode data in a manner suitable for transfer using alternative channels or media, thereby improving the ability for remote or isolated sites to receive data and reduce the possibility of errors caused by unstable or slow digital data transfers.

With reference now to FIG. 1, shown is an example computing environment according to aspects of the present disclosure. Computing environment 100 contains an example of an environment for the execution of at least some of the computer code involved in performing the various methods described herein, such as a human readable prime number compression (HRPNC) module 107. In addition to the HRPNC module 107, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 107, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/ or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document. These computer readable program instructions are stored in various types of computer readable storage media, such as cache 121 and the other storage media discussed below. The program instructions, and associated data, are accessed by processor set 110 to control and direct performance of the computer-implemented methods. In computing environment 100, at least some of the instructions for performing the computer-implemented methods may be stored in block 107 in persistent storage 113.

Communication fabric 111 is the signal conduction path that allows the various components of computer 101 to communicate with each other. Typically, this fabric is made of switches and electrically conductive paths, such as the switches and electrically conductive paths that make up buses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 107 typically includes at least some of the computer code involved in performing the computer-implemented methods described herein.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database), this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the computer-implemented methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
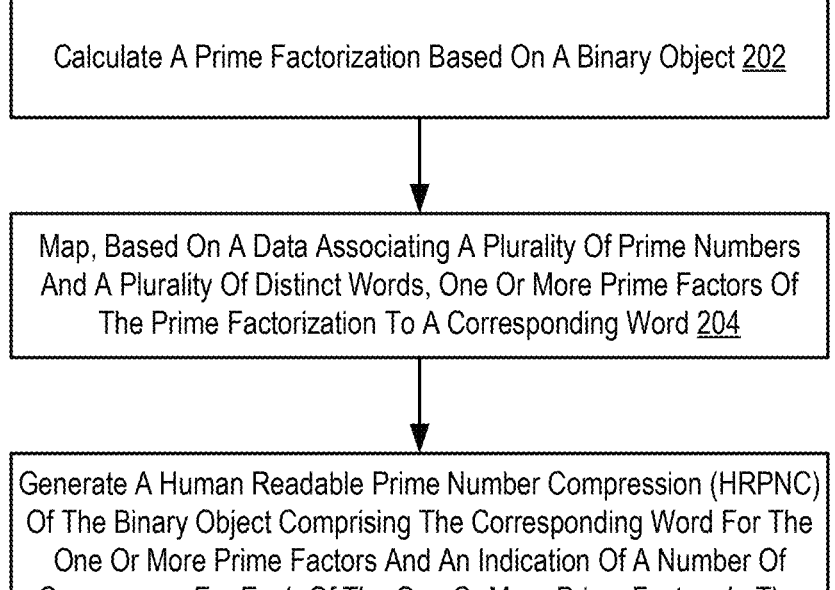
FIG. 2 sets forth a flowchart of an example method of HRPNC in accordance with some embodiments of the present disclosure.

FIG. 2 sets forth a flowchart of an example method of human readable prime number compression (HRPNC) according to some embodiments of the present disclosure. The method of FIG. 2 may be performed, for example, using the HRPNC module 107 of FIG. 1. The method of FIG. 2 includes calculating 202 a prime factorization based on a binary object. A binary object is some instance or unit of data to be compressed using HRPNC. For example, the binary object may include a file, an archive of multiple files, an executable, and other types of data as can be appreciated.

A prime factorization of a given number expresses that given number as a product of one or more prime numbers (of one or more prime factors). Accordingly, calculating a prime factorization for a given number includes calculating the prime factors of that given number. The prime factorization is calculated 202 based on the binary object in that it may be based on a numerical representation of the binary object. For example, in some embodiments, the numerical representation of the binary object may include a numerical expression (e.g., into decimal or some other numerical encoding scheme) of a binary string that encodes the binary object. As another example, as will be described in further detail below, the numerical representation may include the result of applying a compression algorithm (e.g., other than HRPNC as described herein, such as a lossless compression algorithm) to the binary object. As an example, assume a binary object represented by the binary string "0000001100011000." Readers will appreciate that this binary string contains comparatively fewer digits than in most use cases and is abbreviated for the sake of clarity and conciseness. This binary string is the decimal equivalent of "792" with a prime factorization of "$2 \times 2 \times 2 \times 3 \times 3 \times 11$."

The method of FIG. 2 also includes mapping 204, based on data associating a plurality of prime numbers and a plurality of distinct words, one or more prime factors of the prime factorization to a corresponding word. The data includes a table or other data structure with each entry including a prime number and a corresponding word. Although this data will be hereinafter referred to as a "table," other data structures are also contemplated within the scope of the present disclosure. For example, in some embodiments, a table of N entries may include entries for the first N prime numbers.

The table maps prime number to words to facilitate conversion of the prime factorization to a combination of human readable words. The particular set of words mapped by the table may vary according to particular design considerations and may potentially include any set of human readable words. In some embodiments, the table may map prime numbers to a set of words all having a same length (e.g., three letters, four letters, and the like). For example, in some embodiments, assuming there are 1063 three-letter words in the English language, the table may map the first 1063 prime numbers to a different three-letter English word.

In some embodiments, the set of numbers mapped by the table may be selected so as to exclude phonemes (similar sounding words), homophones (similarly spelled words), or other words meeting particular criteria. For example, in some embodiments, a set of words may be dynamically generated based on these criteria or dynamically filtered to exclude words based on these criteria. Such approaches may be used to prevent incorrect entry of words when manually entering a compressed binary object for decompression.

Using this table, each of the prime factors is mapped to a corresponding word. As an example, assuming a table that matches three-letter words to prime numbers, assume that the prime number two maps to "ace," the prime number three maps to "act," and the prime number eleven maps to "ago." Here, the prime factorization of the example binary object may be expressed as "ace, ace, ace, act, act, ago." Readers will appreciate that, in some embodiments, the prime factorization of a given binary object may include prime numbers outside of the range of prime numbers mapped by the table. This will be addressed in further detail below.

The method of FIG. 2 also includes generating 206 a human readable prime number compression (HRPNC) of the binary object comprising the corresponding word for the one or more prime factors and an indication of a number of occurrences for each of the one or more prime factors in the prime factorization. In other words, the mapping of prime factors to words is used to generate a HRPNC of the binary object (e.g., a compressed binary object). The compressed binary object may include a string or other encoding of the words mapped to the prime factors of the prime factorization. In some embodiments, the compressed binary object may include an indication of a number of occurrences that each prime factor occurs in the prime factorization. Returning to the example above, the prime factorization includes three occurrences of the prime number two, two occurrences of the prime number three, and one occurrence of the prime number eleven. Accordingly, the resulting compressed binary object may include the string "3Ace2ActAgo." In this example, the indication of the number of occurrences for a given prime factor is a leading numeral adjacent to the corresponding word. Moreover, in this example, prime factors with a single occurrence (e.g., "ago" or eleven) lack a leading digit. Accordingly, the indication of a number of occurrences of a given prime factor is implicitly included or included by virtue of omission (e.g., the lack of a leading numeral serves as the indication). In some embodiments, the compressed binary object may include a leading digit or other numerical indication of single occurrences of a given prime factor.

Readers will appreciate that the exemplary compressed binary object above is merely exemplary and that other arrangements of words and indications of numbers of occurrences are also contemplated within the scope of the present disclosure. For example, although the above example includes capitalization of each word to facilitate readability of each word, other capitalization schemes may also be used. As another example, although the above example includes indications as leading numerals relative to their corresponding words, tailing numerals or other arrangements of such indications may also be used.

The approaches set forth above allow for conversion of a binary object into a human readable string encoding. This may be useful in a variety of use cases relating to data exchange or transmission. For example, in order to provide data to an air-gapped or black site system without a direct network connection or the ability to load from external media, a human can manually enter the compressed binary object as it is being read by another human using a secure voice line or by reading a printout of the compressed binary object. As another example, optical character recognition (OCR) technology may be used to scan printed or displayed instances of the compressed binary object. As will be described in further detail below, HRPNC can be reversed, thereby decompressing the compressed binary object, in linear time after the compressed binary object has been stored into a computer system.

As another example, highly remote sites, including under water or in space, may have slow or error-prone network connections, increasing the likelihood of data loss when transferring long files. An automated sound loop reading the HRPNC may be used to provide the encoded data to such sites, with the loop serving to fill in any gaps or clarify any previously listed-to portions of the HRPNC. Moreover, using quantum computing to perform HRPNC, data transfer could be sent in n time, having no time difference between sending any amount of data across the internet.

For further explanation, FIG. 3 sets forth a flowchart of an example method of HRPNC according to some embodiments of the present disclosure. The method of FIG. 3 is similar to FIG. 2 in that the method of FIG. 3 also includes: calculating 202 a prime factorization based on a binary object; mapping 204, based on a data associating a plurality of prime numbers and a plurality of distinct words, one or more prime factors of the prime factorization to a corresponding word; and generating 206 a human readable prime number compression (HRPNC) of the binary object comprising the corresponding word for the one or more prime factors and an indication of a number of occurrences for each of the one or more prime factors in the prime factorization.

The method of FIG. 3 differs from FIG. 2 in that the method of FIG. 3 also includes: determining 302 that a particular prime factor of the prime factorization is greater than a greatest prime number in the data associating the plurality of prime numbers and the plurality of distinct words. As is set forth above, in some embodiments, a given prime factorization may include a prime number greater than any prime number mapped by the aforementioned table. Accordingly, it is impossible to map that prime number directly to a corresponding word in the table.

Consider another example with the prime factorization of "1214113112," which is "2×2×2×3×3×11×15329711." In other words, this prime factorization is identical to the previous example with an additional prime factor of "15329711." Using the previous example where the table maps the first 1063 prime numbers to a corresponding three-letter word, 15329711 is greater than the $1063^{rd}$ prime number of 8527. In other words, the particular prime factor of 15329711 is greater than the greatest mapped prime number of 8527.

The method of FIG. 3 also includes calculating 304 another prime factorization of the particular prime factor incremented by one. Incrementing the particular prime factor by one ensures that the prime factors in this other prime factorization are less than the square root of the particular prime factor. The method of FIG. 3 also includes mapping 306, based on the data, one or more other prime factors of the other prime factorization to another corresponding word. Mapping 306 the one or more other prime factors of the prime factorization may be performed according to similar approaches as are set forth above with respect to mapping 204 one or more prime factors of the prime factorization to a corresponding word.

The method of FIG. 3 also includes generating 308 a portion of the HRPNC of the binary object comprising the other corresponding word for the other one or more prime factors and an indication of a number of occurrences for each of the other one or more prime factors in the other prime factorization. The portion of the HRPNC is generated 308 according to similar approaches as are set forth above with respect to generating 206 the HRPNC, instead using the other prime factorization and mappings. Continuing with the example above using the particular prime factor of 15329711, this other prime factorization of (15329711+1) is "2×2×2×2×3×389×821." Using the example mapping of prime numbers to three-letter words, this results in a portion of the HRPNC of "4AceActMapPeg," with "map" mapping to "389" and "peg" mapping to "821."

This portion of the HRPNC may then be included, combined, or encoded with the previously discussed HRPNC using the set of prime factors excluding the particular prime factor that exceeded the greatest mapped number. For example, in some embodiments, the portion of the HRPNC may be separated from a remainder of the HRPNC using a delimiter such as "+" or another character or combination of characters as can be appreciated. Continuing with this example, the binary object represented by "1214113112" and having the prime factorization of "2×2×2×3×3×11× 15329711" would have a compressed binary object of "3Ace2ActAgo+4AceActMapPeg." Here, the compressed binary object includes a first substring corresponding to those prime factors of the binary object that could be mapped and a second substring, identified by a delimiter, corresponding to the prime factor of the initial prime factorization that could not be mapped.

The approaches set forth above address limitations in mapping a limited set of prime numbers to words, allowing for HRPNC to be used on prime factorizations that include a prime factor outside of the mapped range. Readers will appreciate that, as prime numbers grow in discovery logarithmically, as the binary object gets numerically larger, its prime factorization generally includes additional instances of lower prime numbers.

For further explanation, FIG. 4 sets forth a flowchart of an example method of HRPNC according to some embodiments of the present disclosure. The method of FIG. 4 is similar to FIG. 2 in that the method of FIG. 4 also includes: calculating 202 a prime factorization based on a binary object; mapping 204, based on a data associating a plurality of prime numbers and a plurality of distinct words, one or more prime factors of the prime factorization to a corresponding word; and generating 206 a human readable prime number compression (HRPNC) of the binary object comprising the corresponding word for the one or more prime factors and an indication of a number of occurrences for each of the one or more prime factors in the prime factorization.

The method of FIG. 4 differs from FIG. 2 in that the method of FIG. 4 also includes applying 402 a lossless compression algorithm to the binary object. The lossless compression may include any lossless compression algorithm as can be appreciated, such as Hoffman compression. Applying 402 the lossless compression to the binary object reduces the overall size of the binary object, potentially reducing the overall size of the compressed binary object after performing HRPNC and potentially reducing the mathematical complexity of calculating 202 the prime factorization based on the binary object. Accordingly, in such embodiments, the prime factorization of a binary object, or any other data as described herein, may include a prime factorization of the binary object or other data after the lossless compression algorithm has been applied. In other words, any of the operations described herein as being applied or performed on a binary object may also be applied to or performed on an instance of the binary object after applying lossless compression.

For further explanation, FIG. 5 sets forth a flowchart of an example method of HRPNC according to some embodiments of the present disclosure. The method of FIG. 5 is similar to FIG. 2 in that the method of FIG. 5 also includes: calculating 202 a prime factorization based on a binary object; mapping 204, based on a data associating a plurality of prime numbers and a plurality of distinct words, one or more prime factors of the prime factorization to a corresponding word; and generating 206 a human readable prime number compression (HRPNC) of the binary object comprising the corresponding word for the one or more prime factors and an indication of a number of occurrences for each of the one or more prime factors in the prime factorization.

The method of FIGS. 5 and 6 describe how to reverse HRPNC in order to decompress a compressed binary object generated using HRPNC. Although presented alongside approaches for performing HRPNC for clarity, readers will appreciate that the approaches set forth herein relating to decompressing the compressed binary object may be performed by a different entity than one that initially generated the compressed binary object, and therefore may be performed independent of any steps relating to performing HRPNC. For example, decompression of a compressed binary object may be performed by a recipient of some binary object compressed using HRPNC.

The method of FIG. 5 differs from FIG. 2 in that the method of FIG. 5 also includes generating 502, from the HRPNC (e.g., from the compressed binary object) and based on the data associating the plurality of prime numbers and the plurality of distinct words, the prime factorization. In other words, the prime factorization based on the binary object is regenerated using the compressed binary object. Particularly, the same table mapping prime numbers to words should be used to ensure correct conversion between words and their corresponding prime numbers.

As an example, to generate 502 the prime factorization, one or more words may be identified in the compressed binary object. Where the compressed binary object includes multiple portions separated by delimiters, the one or more words may be identified in a particular portion of the compressed binary object (e.g., a leading portion). For each of these one or more words, a number of occurrences may also be identified from the compressed binary object. Using the table, the corresponding prime numbers for each of these words is identified. The prime factorization may then be generated as having each corresponding prime number included according to their number of occurrences. For example, for the compressed binary object "3 Ace2ActAgo," the prime factorization may be generated as "2×2×2×3×3× 11." Readers will appreciate that, in this example, the compressed binary object does not include a portion separated by a delimiter corresponding to a prime factor greater than the greatest mapped number. Such scenarios are described in further detail below.

The method of FIG. 5 also includes generating 504, based on the prime factorization, the binary object. For example, generating 504 the binary object may include multiplying each prime factor in the prime factorization to generate the binary object. Where lossless compression was applied to the binary object before calculating its prime factorization, the generated 504 binary object may include the binary object as reflecting the lossless compression.

Readers will appreciate that, in some embodiments, generating 502 the prime factorization and generating 504 the binary object may be performed in combination or at least partially in parallel. For example, rather than extracting the full prime factorization from the compressed binary object prior to generating the binary object as a product of the full prime factorization, prime factors may be linearly extracted from the compressed binary object and multiplied into an accruing total that will ultimately total to the binary object once parsing of the compressed binary object is complete.

For further explanation, FIG. 6 sets forth a flowchart of an example method of HRPNC according to some embodiments of the present disclosure. The method of FIG. 6 is similar to FIG. 5 in that the method of FIG. 6 also includes: calculating 202 a prime factorization based on a binary object; mapping 204, based on a data associating a plurality of prime numbers and a plurality of distinct words, one or more prime factors of the prime factorization to a corresponding word; generating 206 a human readable prime number compression (HRPNC) of the binary object comprising the corresponding word for the one or more prime factors and an indication of a number of occurrences for each of the one or more prime factors in the prime factorization; generating 502, from the HRPNC and based on the data associating the plurality of prime numbers and the plurality of distinct words, the prime factorization; and generating 504, based on the prime factorization, the binary object.

The method of FIG. 6 differs from FIG. 5 in that generating 502, from the HRPNC and based on the data associating the plurality of prime numbers and the plurality of distinct words, the prime factorization also includes identifying 602 a portion of the HRPNC designated by a delimiter. The delimiter includes a delimiter (e.g., "+" as in the examples above) designating a portion of the HRPNC (e.g., of the compressed binary object) corresponding to a particular prime factor exceeding a greatest mapped prime number. To generate 502 the prime factorization, this particular prime factor must be calculated using the delimited portion of the compressed binary object.

Accordingly, generating 502 the prime factorization also includes calculating 604 a prime factor of the prime factorization (e.g., the particular prime factor described above) by decrementing another prime factorization encoded by the portion of the HRPNC. As is set forth, a substring of the HRPNC designated by the delimiter may be used to encode another prime factorization calculated by incrementing the particular prime factor by one. Thus, to calculate 604 the prime factor, this substring may be decoded using similar approaches as are set forth above and then decremented by one.

Returning to the example above for a compressed binary object of "3Ace2ActAgo+4AceActMapPeg," a first portion of the prime factorization may be calculated as described above using the substring of the compressed binary object occurring before the delimiter. This results in a first portion of the prime factorization of "2×2×2×3×3×11." A second portion of the prime factorization may then be calculated using the "4AceActMapPeg" substring occurring after the delimiter. This substring converts to "2×2×2×2×3×389× 821," equal to a value of 15329712. Decrementing this value by one results in the particular prime factor of 15329711. Thus, in combination with the other portion of the prime factorization, this results in a prime factorization of the binary object of "2×2×2×3×3×11×15329711." When multiplied together, this prime factorization equals the original binary object of 1214113112. Thus, the original binary object has been reconstructed using a string including human-readable words and associated numbers of occurrences in a prime factorization.

Readers will appreciate that, in order to perform HRPNC on a given binary object, a prime factorization may need to be performed on potentially large numbers. Such prime factorizations may take an indeterminate or unpredictable amount of time to complete and, in some instances, may be impossible to complete. Accordingly, it may be beneficial to attempt acceleration of HRPNC for a given binary object using simultaneous or parallel HRPNC compression.

Figure 7:
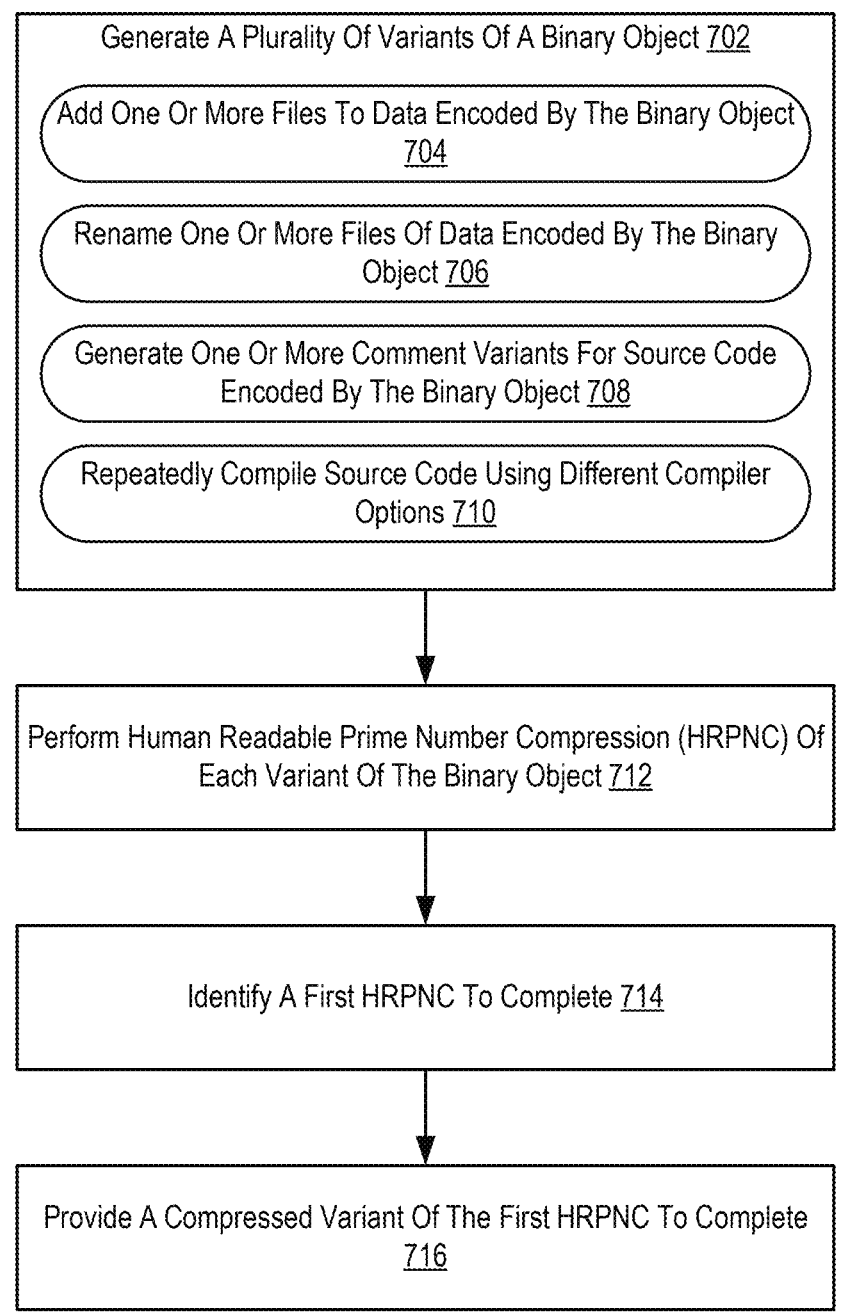
FIG. 7 sets forth a flowchart of an example method of adjusting files for HRPNC acceleration in accordance with some embodiments of the present disclosure.

Accordingly, for further explanation, FIG. 7 sets forth a flowchart of an example method of adjusting files for human readable prime number compression (HRPNC) acceleration in accordance with some embodiments of the present disclosure. The method of FIG. 7 includes generating 702 a plurality of variants of a binary object. In some embodiments, generating 702 the plurality of variants of a binary object may be performed in response to a command or signal to perform HRPNC on the binary object. In some embodiments, generating 702 the plurality of variants of the binary object may be performed in response to an amount of time spent performing HRPNC on the binary object exceeding some time threshold. In some embodiments, a variant of a given binary object is a different version of the given binary object that is functionally identical or equivalent despite including different data. Accordingly, in some embodiments, generating 702 the plurality of variants of a binary object may include a variety of approaches depending on the data encoded by the binary object.

For example, in some embodiments, generating 702 the plurality of variants of a binary object may include adding 704 one or more files to data encoded by the binary object. This may be used, for example, where the binary object encodes an archive of files, a portion of a file system, or other embodiments where multiple files are encoded into a binary object. As an example, one or more files of empty data or one or more folders may be added. As another example, one or more files of data that are not accessed (e.g., by code or executable content in the binary object) may be added. Though such variants include different data by virtue of these added files, such variants remain functionally equivalent to the original binary object. In some embodiments, adding 704 one or more files to the data encoded by the binary object may include recompiling or repackaging the data to generate a variant binary object.

In some embodiments, generating 702 the plurality of variants of a binary object may include renaming 706 one or more files of data encoded by the binary object. In some embodiments, renaming 706 the one or more files of data may include modifying one or more references (e.g., in code or other encoded data) to the one or more files to reflect their updated names. Again, though such variants include different data by virtue of these different names, such variants remain functionally equivalent to the original binary object. In some embodiments, renaming 706 the one or more files of data encoded by the binary object may include recompiling or repackaging the data to generate a variant binary object.

In some embodiments, generating 702 the plurality of variants of a binary object may include generating 708 one or more comment variants for source code encoded by the binary object. A comment variant for source code is an instance of source code differing from another instance of that source code in their comments. In other words, comment variants for source code may include functionally identical or equivalent source code with different comments. In some embodiments, where the binary object includes files of uncompiled code, such as an archive, such comment variants may be reflected in the uncompiled code stored in the different variant binary objects. In some embodiments, where the binary object includes an executable compiled from source code, such comment variants may be reflected in the source code prior to compilation into a variant binary object. As an example, in some embodiments, generating 708 a comment variant may include, for a given file of source code, adding a comment, removing an existing comment, modifying an existing comment, and the like.

In some embodiments, generating 702 the plurality of variants of a binary object may include repeatedly 710 compiling source code using different compiler options. In other words, where a binary object includes compiled code, a same code base may be compiled in different ways to generate different variants of the binary object. Such different compiler options may include, for example, different flags or parameters used in commands (e.g., command line interface (CLI) commands or other commands as can be appreciated) or other variable options as can be appreciated.

In some embodiments, generating 702 the plurality of variants may be performed automatically. For example, in some embodiments, the variations described above may be programmatically performed (e.g., on source code or files encoded into the binary object) to generate some number of variants. In some embodiments, the particular number of variants may be predefined, determined based on a configuration option or user-provided command, learned over time based on historically performed HRPNC, dynamically calculated based on amount of computational and storage resources, and the like. Readers will appreciate that the examples set forth above for generating 702 variants of a binary object are merely illustrative and that other approaches are also contemplated within the scope of the present disclosure. Moreover, readers will appreciate that the example approaches for generating 702 variants set forth above, as well as other approaches not explicitly set forth, may be used individually or in combination with each other.

In some embodiments, generating 702 the plurality of variants may be facilitated by a generative artificial intelligence (AI) model such as a large language model (LLM) or another generative AI model as can be appreciated. For example, the generative AI model may be used when renaming files such that the renamed files are based on synonyms or other variations of their original names. As another example, the generative AI model may be used to generate or modify comments in source code.

The method of FIG. 7 also includes performing 712 HRPNC on each variant of the binary object. In some embodiments, performing 712 HRPNC on each variant of the binary object may include performing HRPNC on each of the generated 702 variants and may also include performing HRPNC on the original binary object. In other words, the original binary object may also be considered a variant as it differs from other generated 702 variants of the binary object.

Performing 712 HRPNC on each variant of the binary object may be performed using similar approaches as are set forth above. When and if completed, HRPNC on a given variant of the binary object results in a compressed variant. Here, performing 712 HRPNC on each variant of the binary object includes beginning HRPNC on each variant of the binary object without necessarily waiting or expecting HRPNC to complete for each variant. In some embodiments, HRPNC may be performed on each variant of the binary object at least partially in parallel such that HRPNC is applied to each variant substantially simultaneously.

The method of FIG. 7 also includes identifying 714 a first HRPNC to complete. In other words, for each HRPNC that was initialized when performing 712 HRPNC on each variant of the binary object, a first one to complete is identified or detected. The method of FIG. 7 also includes providing 716 a compressed variant of the first HRPNC to complete. In other words, the output or result of the first HRPNC to complete is provided as a compressed variant. In some embodiments, providing 716 the compressed variant may include providing 716 the compressed variant as some output or response to a command to compress the binary object using HRPNC. In some embodiments, providing 716 the compressed variant may include storing data encoding the compressed variant.

Consider an example where a user wishes to perform HRPNC on a binary object encoding a file archive. After some amount of time, it may be determined that performing HRPNC on this binary object is either computationally prohibitive or potentially impossible. For example, a time threshold may have been reached or the user may automatically indicate that they instead wish to attempt HRPNC on variants of the file archive. Accordingly, variants of this file archive may be generated having renamed files, additional empty files, and the like so as to introduce variation in the encoded binary objects and therefore in their prime factorizations. Once HRPNC for one of these variants has been completed, the compressed variant may then be provided as output and distributed as desired by the user.

Readers will appreciate that, as each variant of the binary object differs in some way their resulting prime factorizations will differ. Moreover, the computational complexity and resource utilization of calculating these prime factors may differ greatly across variants. Accordingly, by generating multiple variants and applying HRPNC to them concurrently, the likelihood of a variant having a computationally lower, or even computationally possible, prime factorization increases.

For further explanation, FIG. 8 sets forth a flowchart of another example method of adjusting files for human readable prime number compression (HRPNC) acceleration in accordance with some embodiments of the present disclosure. The method of FIG. 8 is similar to FIG. 7 in that the method of FIG. 8 also includes generating 702 a plurality of variants of a binary object. In some embodiments, a variant of a given binary object is a different version of the given binary object that is functionally identical despite including different data, including: adding 704 one or more files to data encoded by the binary object; renaming 706 one or more files of data encoded by the binary object; generating 708 one or more comment variants for source code encoded by the binary object; or repeatedly 710 compiling source code using different compiler options; performing 712 HRPNC on each variant of the binary object; identifying 714 a first HRPNC to complete; and providing 716 a compressed variant of the first HRPNC to complete.

The method of FIG. 8 differs from FIG. 7 in that the method of FIG. 8 also includes terminating 802, in response to identifying the first HRPNC to complete, any incomplete HRPNC of each variant of the binary object. As some instance of HRPNC on a variant of the binary object has been completed, it may not be necessary to continue HRPNC on the remaining variants of the binary object. Accordingly, in some embodiments, these other HRPNC processes may be terminated to save on overall resource usage. In some embodiments, after terminating these other HRPNC processes, one or more of their respective variants may also be deleted to reduce overall storage space usage.

Figure 9:
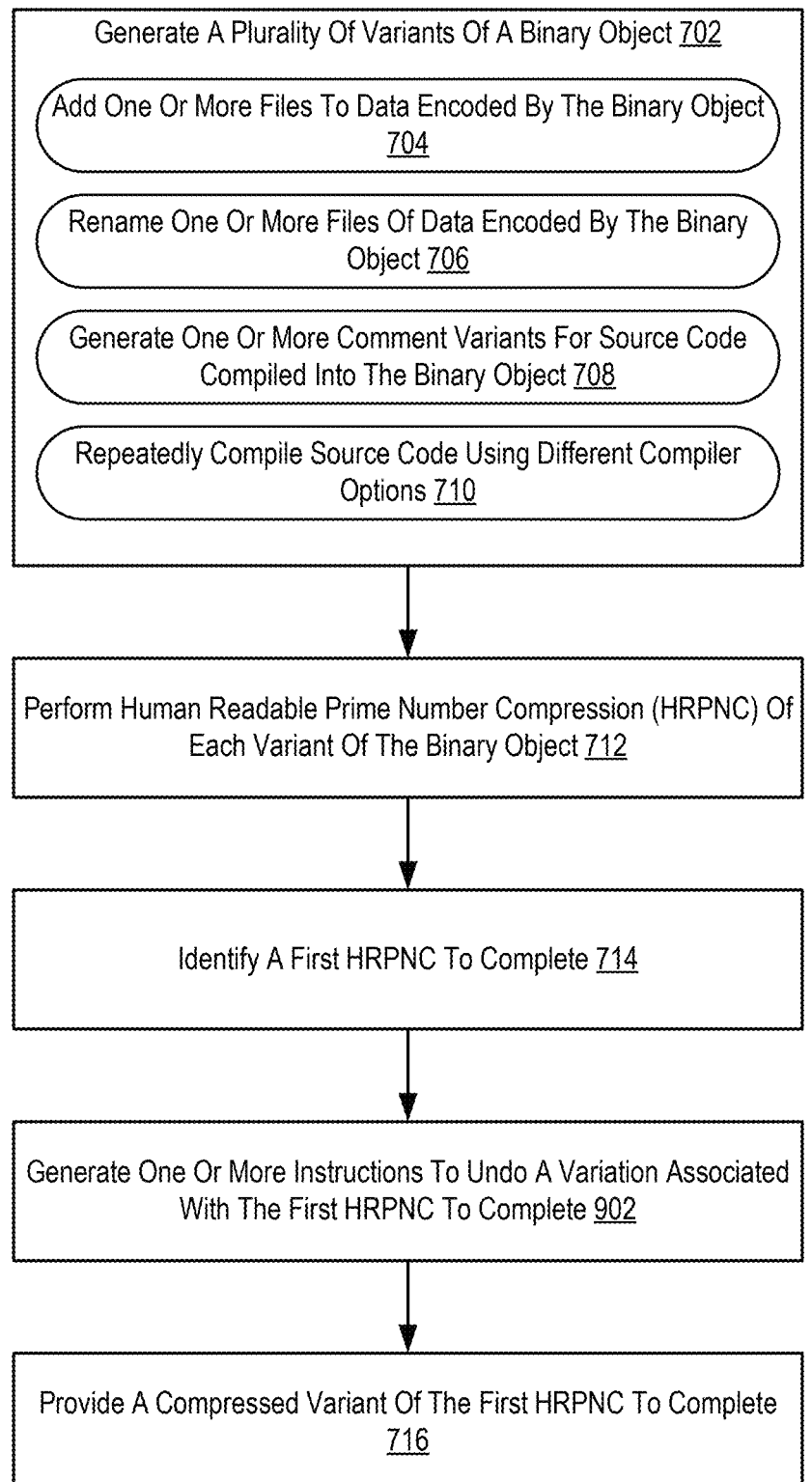
FIG. 9 sets forth a flowchart of another example method of adjusting files for HRPNC acceleration in accordance with some embodiments of the present disclosure.

For further explanation, FIG. 9 sets forth a flowchart of another example method of adjusting files for human readable prime number compression (HRPNC) acceleration in accordance with some embodiments of the present disclosure. The method of FIG. 9 is similar to FIG. 7 in that the method of FIG. 9 also includes generating 702 a plurality of variants of a binary object. In some embodiments, a variant of a given binary object is a different version of the given binary object that is functionally identical despite including different data, including: adding 704 one or more files to data encoded by the binary object; renaming 706 one or more files of data encoded by the binary object; generating 708 one or more comment variants for source code encoded by the binary object; or repeatedly 710 compiling source code using different compiler options; performing 712 HRPNC on each variant of the binary object; identifying 714 a first HRPNC to complete; and providing 716 a compressed variant of the first HRPNC to complete.

The method of FIG. 9 differs from FIG. 7 in that the method of FIG. 9 also includes generating 902 one or more instructions to undo a variation associated with the compressed variant (e.g., the first HRPNC to complete). The one or more instructions, when executed, revert the variant binary object (e.g., as encoded by the compressed variant) to the original binary object from which the variant binary object was generated. The one or more instructions may include, for example, executable code, scripts, and the like.

In some embodiments, the one or more instructions may be stored or provided as a separate output or data payload from the compressed variant. Thus, when providing or transmitting the compressed variant, the one or more instructions must also be separately transmitted or provided. In some embodiments, the one or more instructions (e.g., data encoding the one or more instructions) may also be compressed using HRPNC. In such embodiments, the one or more instructions may be encoded with or appended to the compressed variant. For example, another delimiter may be used to separate an HRPNC encoding of the one or more instructions from an HRPNC encoding of the one or more instructions in the same string encoding.

Although the method of FIG. 9 shows generating 902 the one or more instructions as being performed in a particular ordering of steps, readers will appreciate that, in some embodiments, generating 902 the one or more instructions may be performed at other times. For example, in some embodiments, generating 902 the one or more instructions may be performed as part of generating 702 the plurality of variants. For example, when generating 702 the plurality of variants, the one or more instructions may be generated 902 and stored for later use. As another example, the one or more instructions may be generated 902 and included as data encoded in the corresponding variant itself.

Readers will also appreciate that, though the method of FIG. 9 describes generating 902 one or more instructions to undo a variation associated with the compressed variant, instructions may also be generated for other variants. For example, when generating 702 the plurality of variants, instructions to undo each of these generated variants may be generated and stored for later use, encoded with their respective variants, and the like.

The approaches set forth above facilitate reversal of a variation introduced to accelerate HRPNC of a binary object. Although the variations may be functionally equivalent, a user may wish to nonetheless restore a variant to its original state. The generated one or more instructions facilitate automatic reversal of any introduced variants.

Figure 10:
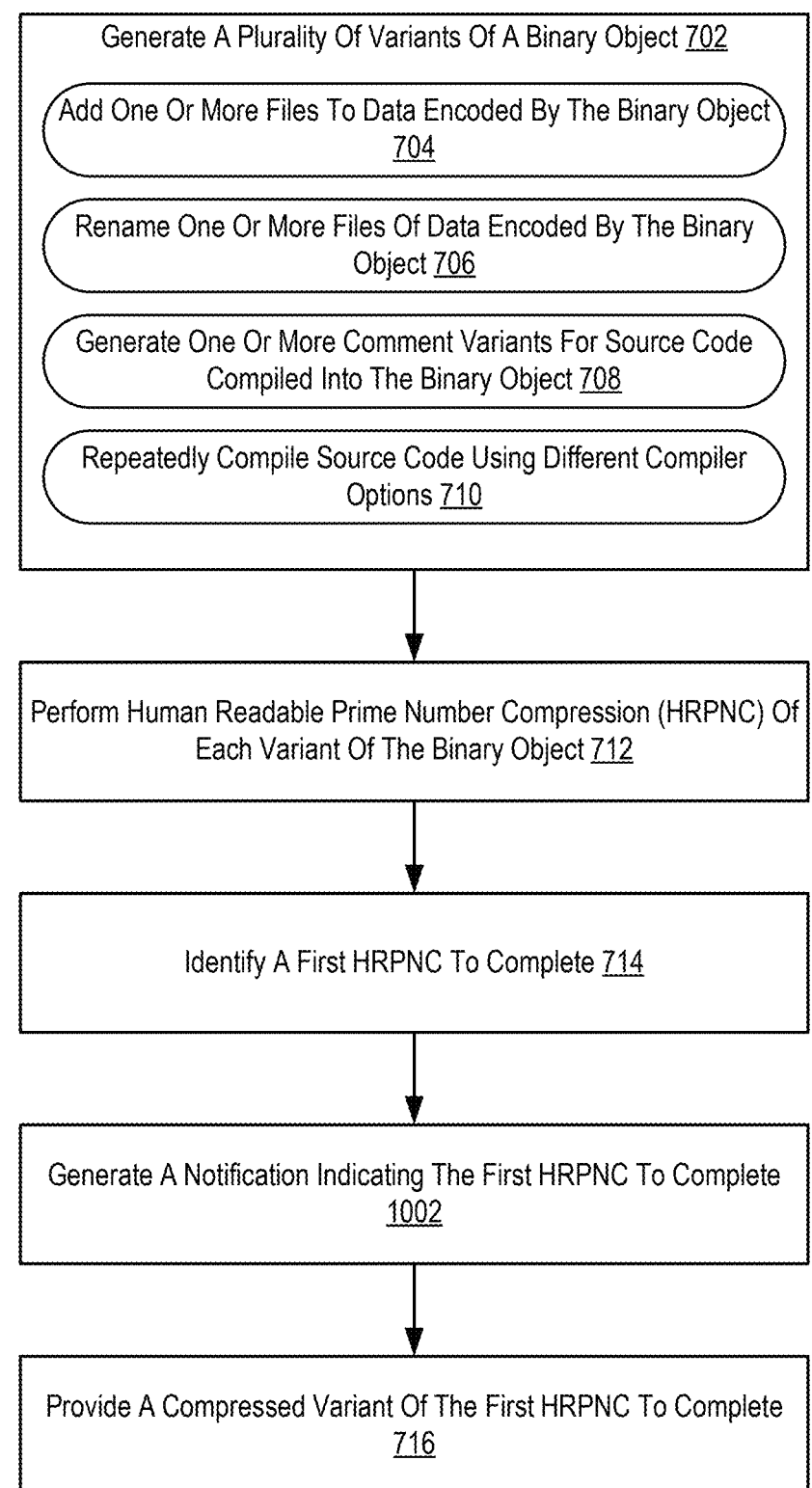
FIG. 10 sets forth a flowchart of another example method of adjusting files for HRPNC acceleration in accordance with some embodiments of the present disclosure.

For further explanation, FIG. 10 sets forth a flowchart of another example method of adjusting files for human readable prime number compression (HRPNC) acceleration in accordance with some embodiments of the present disclosure. The method of FIG. 10 is similar to FIG. 7 in that the method of FIG. 10 also includes generating 702 a plurality of variants of a binary object. In some embodiments, a variant of a given binary object is a different version of the given binary object that is functionally identical despite including different data, including: adding 704 one or more files to data encoded by the binary object; renaming 706 one or more files of data encoded by the binary object; generating 708 one or more comment variants for source code encoded by the binary object; or repeatedly 710 compiling source code using different compiler options; performing 712 HRPNC on each variant of the binary object; identifying 714 a first HRPNC to complete; and providing 716 a compressed variant of the first HRPNC to complete.

The method of FIG. 10 differs from FIG. 7 in that the method of FIG. 10 also includes generating 1002 a notification indicating the first HRPNC to complete. In some embodiments, the notification may identify a particular variant compressed into the compressed variant. In some embodiments, the notification may include or provide a reference to the compressed variant. In some embodiments, the notification may include performance metrics or statistics associated with the first HRPNC to complete, such as a time to complete, an amount of computational or storage resources used, and the like. In some embodiments, the notification may include one or more selectable elements for various actions that may be taken in response to completion compression of the compressed variant. For example, the notification may allow a user to manually terminate incomplete HRPNC processes, delete variants used in incomplete HRPNC processes, and the like.

For further explanation, FIG. 11 sets forth a flowchart of an example method of salting binaries for HRPNC in accordance with some embodiments of the present disclosure. The method of FIG. 11 includes detecting 1102, during HRPNC of a binary object, that a time threshold has been reached. HRPNC of the binary object may be performed according to similar approaches as are set forth above. In some embodiments, the time threshold may include a predefined time threshold. In some embodiments, the time threshold may include a configurable or user-defined time threshold. In some embodiments, the time threshold may be dynamically calculated as a function of various factors such as current resource usage or resource usage over time, a size of the binary object, and the like. Reaching the time threshold may indicate, for example, that HRPNC of the binary object is determined to be prohibitively complex when calculating the prime factorization for the binary object.

The method of FIG. 11 also includes generating 1104, in response to the time threshold being reached, one or more salted variants of the binary object by applying, to the binary object, a corresponding salt value. As is set forth above, the time and computational resources required to calculate prime factorizations of different values may vary significantly. Accordingly, different versions or modifications of a binary object may have varying levels of complexity and resource utilization when calculating their prime factorizations for HRPNC. In contrast to the approaches described above where variants of a binary object are created by modifying the underlying data of the binary object, salted variants of the binary object are generated 1104 by applying a salt value to the binary object.

A salt value is some numerical value applied to the binary object using a mathematical or logical operation. For example, in some embodiments, applying a salt value to the binary object may include adding the salt value. Other mathematical or logical operations may also be used when applying the salt value. In some embodiments, generating 1104 the one or more salted variants may include applying the same operation to the binary object using different salt values. In some embodiments, generating 1104 the one or more salted variants may include applying different operations to the binary object using similar or differing values. In some embodiments, the number of salted variants to be generated 1104 may be predefined, configurable, dynamically calculated based on available processing or storage resources, learned based on historical HRPNC activity, and the like.

The particular salt values to apply when generating 1104 the salted variants may vary according to particular design or engineering considerations. In some embodiments, the salt values may be randomly generated. In some embodiments, where the salt values are randomly generated, such salt values may be randomly generated according to various constraints, such as a minimum or maximum salt value or other constraints as can be appreciated. In some embodiments, the salt values may be selected (e.g., randomly or using another approach) from a selection of prime numbers. For example, in some embodiments, the salt values may be selected from the set of prime numbers mapped to corresponding words used in HRPNC as described above with respect to the table used in HRPNC. In some embodiments, the salt values may be calculated as a factor of some prime number in that set of prime numbers. For example, a prime number may be selected from the set of mapped prime numbers and a multiplication factor may be generated or selected as some integer value. A salt value may then be calculated as a product of the multiplication factor and the selected prime number. As will be described in further detail below, salt values equal to or factors of mapped prime numbers will facilitate encoding the salt value using HRPNC.

The method of FIG. 11 also includes performing 1106 HRPNC on each of the one or more salted variants of the binary object. Performing 1106 HRPNC on each of the one or more salted variants of the binary object includes initiating HRPNC on each of the one or more salted variants without necessarily completing HRPNC on the one or more salted variants. In some embodiments, HRPNC on each of the one or more salted variants is performed 1106 at least partially in parallel such that HRPNC on each of the one or more salted variants occurs substantially simultaneously.

The method of FIG. 11 also includes providing 1108 a compressed salted. In some embodiments, the compressed salted variant may include a compressed salted variant of a first HRPNC to complete. In some embodiments, where HRPNC has completed for multiple compressed salted variants, the provided compressed salted variant may include a shortest compressed salted variant (e.g., by character length), a simplest compressed salted variant (e.g., having the fewest mapped words), or another compressed salted variant as can be appreciated. In other words, in response to detecting a first HRPNC to complete, the output of the first HRPNC to complete (e.g., the compressed salted variant) is provided 1108. Providing 1108 the compressed salted variant may include outputting the compressed salted variant (e.g., the string encoding resulting from HRPNC), storing the compressed salted variant, and the like. Thus, after concurrently compressing multiple salted variants using HRPNC, the compressed salted variant of the first HRPNC is provided 1108.

Other actions may also be taken in response to detecting a first HRPNC to complete. For example, in some embodiments, a notification may be generated indicating the first HRPNC to complete, the corresponding salted variant, the corresponding salt value, associated performance metrics, and the like. As another example, in some embodiments, incomplete HRPNC processes for the remaining salted variants may be automatically terminated. As a further example, the remaining salted variants may be automatically deleted.

Readers will appreciate that, in order to decompress the compressed salted variant, the salt value used to generate the respective salted variant is required. Moreover, where different operations may be used when applying a salt value, an operation identifier indicating an operation used in applying the salt value is also required. Accordingly, in some embodiments, the salt value may be provided to a recipient of the compressed salted variant as a separate data payload, transmission, and the like. In such embodiments, the salt value may itself be compressed using HRPNC. In other embodiments, as will be described in further detail below, the salt value may be encoded with the compressed salted variant with or without the salt value being compressed using HRPNC.

Although the method of FIG. 11 describes generating salted variants and performing HRPNC on those salted variants in response to a time threshold being reached for compressing a binary object, readers will appreciate that the approaches described herein may also be used without any particular time threshold being reached. For example, multiple salted variants may be automatically generated for HRPNC in response to a user command to compress the original binary object.

The approaches set forth above provide for accelerated HRPNC using salted binaries. Applying salt values to a binary object introduces variation into the binary object, resulting in multiple salted variants. These salted variants may have differing computational requirements in calculating their respective prime factorizations. Accordingly, as more salted variants are used, the likelihood of a salted variant completing HRPNC within time or resource constraints may increase.

Figure 12:
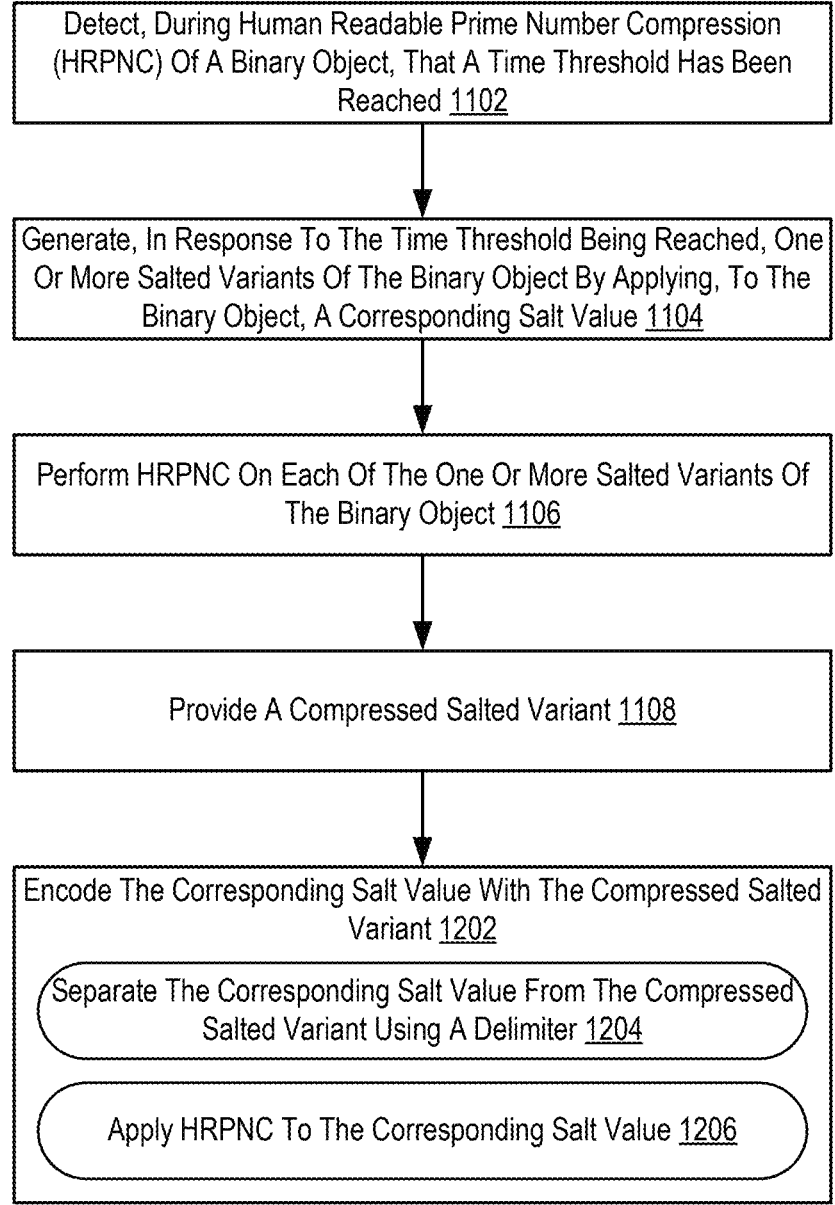
FIG. 12 sets forth a flowchart of another example method of salting binaries for HRPNC in accordance with some embodiments of the present disclosure.

For further explanation, FIG. 12 sets forth a flowchart of another example method of salting binaries for HRPNC in accordance with some embodiments of the present disclosure. The method of FIG. 12 is similar to FIG. 11 in that the method of FIG. 12 also includes: detecting 1102, during human readable prime number compression (HRPNC) of a binary object, that a time threshold has been reached; generating 1104, in response to the time threshold being reached, one or more salted variants of the binary object by applying, to the binary object, a corresponding salt value; performing 1106 HRPNC on each of the one or more salted variants of the binary object; and providing 1108 a compressed salted variant.

The method of FIG. 12 differs from FIG. 11 in that the method of FIG. 12 also includes encoding 1202 the corresponding salt value with the compressed salted variant. In other words, a single encoding (e.g., a single string encoding) may be generated that includes the compressed salted variant and the corresponding salt value. In some embodiments, the corresponding salt value may be separated from the compressed salted variant using a delimiter. Accordingly, in some embodiments, encoding 1202 the corresponding salt value with the compressed salted variant may include separating 1204 the corresponding salt value from the compressed salted variant using a delimiter.

Consider an example binary object having a numerical representation of 15329607. Assume that, of multiple salted variants, a particular salted variant having an added salt value of 104 finishes HRPNC first. This compressed salted variant may be expressed as "3Ace2ActAgo+4AceAct-MapPeg," the HRPNC encoding of (15329607+ 104=15329711). In this example, a delimiter such as "#" may be used to separate the compressed salted variant from the salt value, resulting in a string encoding of "3Ace2ActAgo+4AceActMapPeg#104").

In some embodiments, where potentially multiple different operations may be used when applying a salt value, the delimiter may include an operation identifier. As an example, in some embodiments, each possible operation may be mapped to a different character (e.g., "−" for subtraction, "*" for multiplication, and the like). The character mapped to the particular operation may serve as a delimiter to indicate the salt value. In some embodiments, a combination of characters may be used as a delimiter and operation identifier. This may be useful, for example, where certain special characters associated with mathematical or logical operations may be used elsewhere as a delimiter. For example, the single character delimiter "+" is already used for a particular purpose. Accordingly, to indicate addition as the salting operation, a first delimiter "#" may indicate that the subsequent character "+" is to be treated as an operation identifier, with the salt value following the operation identifier. In other words, "3Ace2ActAgo+4AceActMapPeg#+ 104" may indicate addition of the salt value, "3Ace2ActAgo+4AceActMapPeg#*104" may indicate multiplication of the salt value, and the like. Other combinations or ordering of delimiters and values are also contemplated within the scope of the present disclosure.

In some embodiments, the corresponding salt value may be encoded using HRPNC. Accordingly, in some embodiments, encoding 1202 the corresponding salt value with the compressed salted variant includes applying 1206 HRPNC to the corresponding salt value. Here, the salt value of 104 was calculated as a product of the mapped prime number 13 (e.g., 8×13=104). Accordingly, the salt value may be encoded as "3AceAha." Thus, the compressed salted variant and corresponding salt value may be encoded as "3Ace2ActAgo+4AceActMapPeg#3AceAha".

In order to generate the binary object from the compressed salted variant, the salted variant is generated by decompressing the compressed salted variant as described above. Where the corresponding salt value is also compressed using HRPNC, the corresponding salt value must also be decompressed. After generating the salted variant, application of the corresponding salt value is reversed using the inverse of the salting operation. This results in the original binary object.

Figure 13:
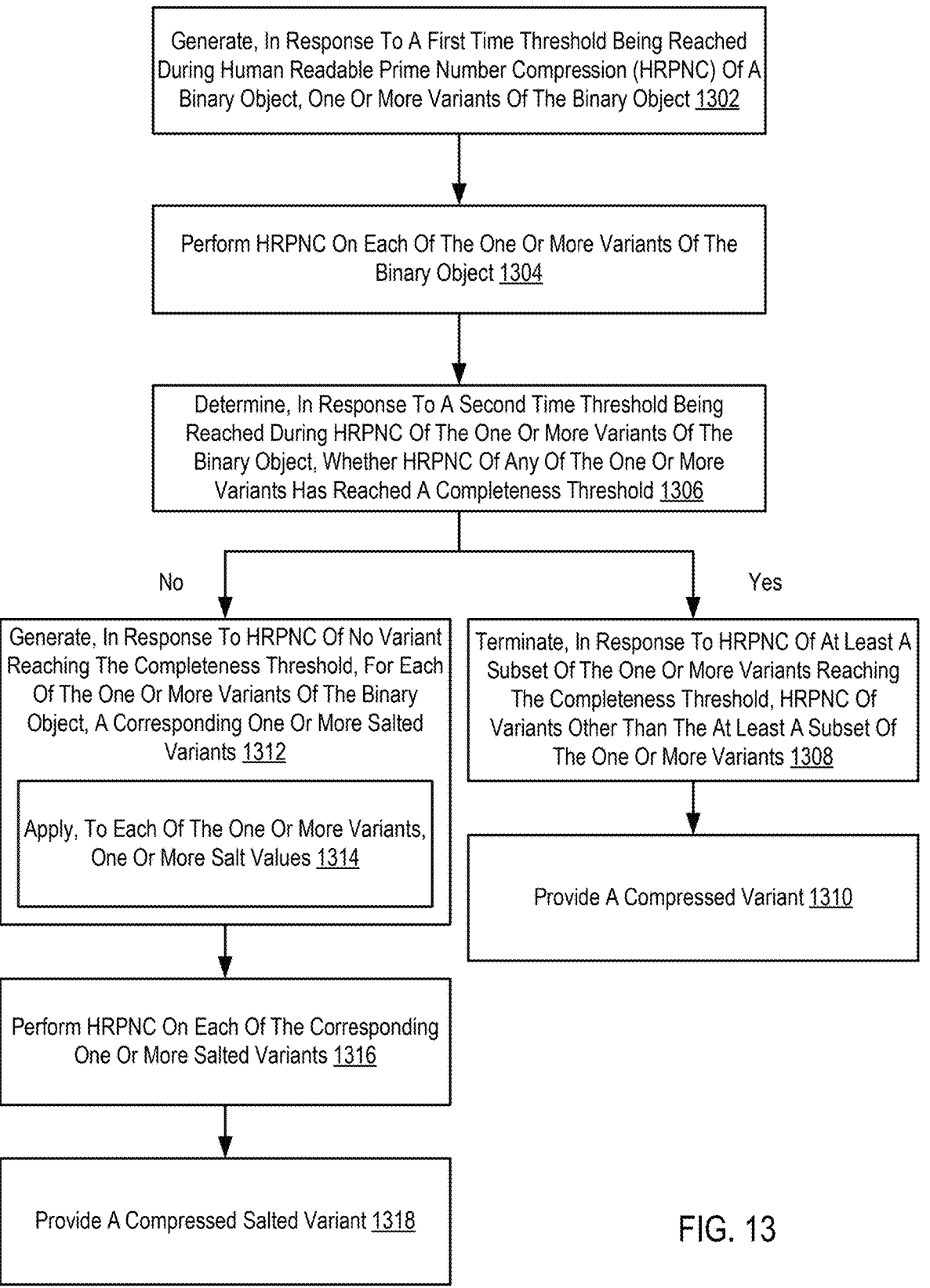
FIG. 13 sets forth a flowchart of an example method of HRPNC for binary variations in accordance with some embodiments of the present disclosure.

For further explanation, FIG. 13 sets forth a flowchart of an example method of HRPNC for binary variations in accordance with some embodiments of the present disclosure. The method of FIG. 13 includes generating 1302, in response to a first time threshold being reached during HRPNC of a binary object, one or more variants of the binary object. The first time threshold may be reached after a threshold amount of time has passed since beginning HRPNC of the binary object without HRPNC of the binary object completing. The first time threshold may include, for example, a predefined threshold, a configurable threshold, a dynamically calculated threshold, and the like. In some embodiments, HRPNC of the binary object may be terminated in response to the first time threshold being reached.

The one or more variants of the binary object may be generated using any of the approaches set forth above with respect to generating binary object variants. This may include, for example, adding files to or renaming files in data encoded by the binary object, generating comment variations, recompiling the binary object with different options, and the like. The number of variants of the binary object may also be predefined, configurable, dynamically calculated, and the like.

The method of FIG. 13 also includes performing 1304 HRPNC on each of the one or more variants of the binary object. In other words, HRPNC is initiated for each of the one or more variants of the binary object. Performing 1304 HRPNC for each of the one or more variants of the binary object may be performed using similar approaches as are set forth above. For example, in some embodiments, performing 1304 HRPNC for each of the one or more variants may be performed at least partially in parallel such that HRPNC may be performed for each of the one or more variants substantially simultaneously.

The method of FIG. 13 also includes determining 1306, in response to a second time threshold being reached during HRPNC of the one or more variants of the binary object, whether HRPNC of any of the one or more variants has reached a completeness threshold. The second time threshold may be reached when a threshold amount of time has been reached since initiating HRPNC for each of the one or more variants of the binary object without HRPNC for any of the one or more variants completing. The second time threshold may include, for example, a predefined threshold, a configurable threshold, a dynamically calculated threshold, and the like. In some embodiments, the second time threshold may be less than the first time threshold. For example, in some embodiments, the first threshold may correspond to a time at which it may be determined or assumed that HRPNC of some binary object is computationally prohibitive or impossible while the second time threshold may correspond to a lesser time as, in some embodiments, HRPNC of some of the variants may continue after reaching the second time threshold.

The completeness threshold corresponds to a measured or estimated amount of progress in performing HRPNC on some binary object, such as the one or more variants of the binary object described above. The measured or estimated amount of progress in performing HRPNC may correspond to or be based on a measured or estimated amount of progress in calculating the prime factorization for the binary object subject to HRPNC (e.g., the one or more variants of the binary object). In other words, HRPNC progress is measured or estimated for each of the one or more variants and compared to the completeness threshold.

If HRPNC of any of the one or more variants has reached the completeness threshold, the method of FIG. 13 proceeds to terminating 1308, in response to HRPNC of at least a subset of the one or more variants reaching the completeness threshold, HRPNC of variants other than the at least a subset of the one or more variants. In some embodiments, the at least a subset of the one or more variants may include all of the one or more variants whose HRPNC reached the completeness threshold. In some embodiments, the at least a subset of the one or more variants may include a subset of those variants whose HRPNC reached the completeness threshold, such as a variant having a highest amount of HRPNC progress, the top N variants having a highest amount of HRPNC progress, and the like. Thus, HRPNC continues only for those variants in the at least a subset of the one or more variants whose progress reached the completeness threshold.

The method of FIG. 13 also includes and providing 1310 a compressed variant. In some embodiments, the compressed variant may include a compressed variant of a first HRPNC to complete (e.g., from the at least a subset of the one or more variants whose HRPNC was not terminated 1308 as described above). In some embodiments, the compressed variant may include another compressed variant, such as a simplest (e.g., having the fewest mapped words, the shortest). Providing 1310 the compressed variant may be performed according to similar approaches as described above with providing the output of applying HRPNC to some binary object. In some embodiments, the method of FIG. 13 may be allowed to continue attempting to compress other variants (up to one of the threshold times) to see if others complete that may have a simpler HRPNC than the first one to complete. For example, the first HRPNC to complete may be "3Ace2ActAgo+4AceActMapPeg#3 AceAha", but maybe there is another variant that compressed to a much simpler "3Dog+2Met*Fry". Even though the second one took longer, the shorter HRPNC may be preferred.

If it is determined 1306 that HRPNC of no variant has reached the completeness threshold, the method of FIG. 13 proceeds to generating 1312, in response to HRPNC of no variant reaching the completeness threshold, for each of the one or more variants of the binary object, a corresponding one or more salted variants. In other words, for each of N variants of the binary object, a set of M salted variants are generated, thereby generating M*N salted variants. The number of salted variants to generate for each variant may be predefined, configurable, dynamically calculated, and the like. In some embodiments, in response to no variant having reached the completeness threshold, HRPNC of any or all of the variants of the binary object may be terminated.

Generating a salted variant from a variant of the binary object includes applying a salt value to the variant of the binary object. Accordingly, in some embodiments, generating 1312 the corresponding one or more salted variants may include applying 1314, to each of the one or more variants, one or more salt values. The particular salt values used in generating the salted variants may be calculated or selected according to any of the approaches set forth above. For example, the salt values to be applied may be randomly calculated, selected from a set of prime numbers mapped to words for HRPNC, calculated as factors of those prime numbers, and the like. Applying these salt values may include various mathematical or logical operations, including addition, subtraction, multiplication, and the like. In some embodiments, the same selection of salt values may be applied to each of the one or more variants. In some embodiments, different selections of salt values may be applied to each of the one or more variants. In some embodiments, the same or different numbers of salt values may be applied to each of the one or more variants.

The method of FIG. 13 also includes performing 1316 on each of the corresponding one or more salted variants and providing 1318 a compressed salted variant. In some embodiments, the compressed salted variant may include a first HRPNC to complete (e.g., of the salted variants being compressed). In some embodiments, the compressed salted variant may include a shortest or simplest compressed salted variant, or another salted variant as can be appreciated. For example, as HRPNC of none of the N variants reached the completeness threshold by the point of reaching the second time threshold, this may indicate that HRPNC of these N variants may be computationally prohibitive or impossible. Accordingly, additional variations are introduced by applying M salt values to these N variants, producing M*N salted variants. By introducing additional variations of the binary object, the likelihood of HRPNC completing within some time or resource constraints increases.

Readers will appreciate that, at various points of the method described by FIG. 13, HRPNC of some binary object (e.g., the original binary object or a variant) may complete before the first or second time thresholds have been reached. In such embodiments, the method of FIG. 13 may end and the product of that HRPNC may be provided. As an example, in some embodiments, should HRPNC of the original binary object complete before reaching the first time threshold, the steps shown in FIG. 13 need not be performed. As another example, if HRPNC of a variant of the binary object completes before reaching the second time threshold, determining 1306 whether HRPNC of any of the one or more variants has reached a completeness threshold and the following steps need not be performed.

Figure 14:
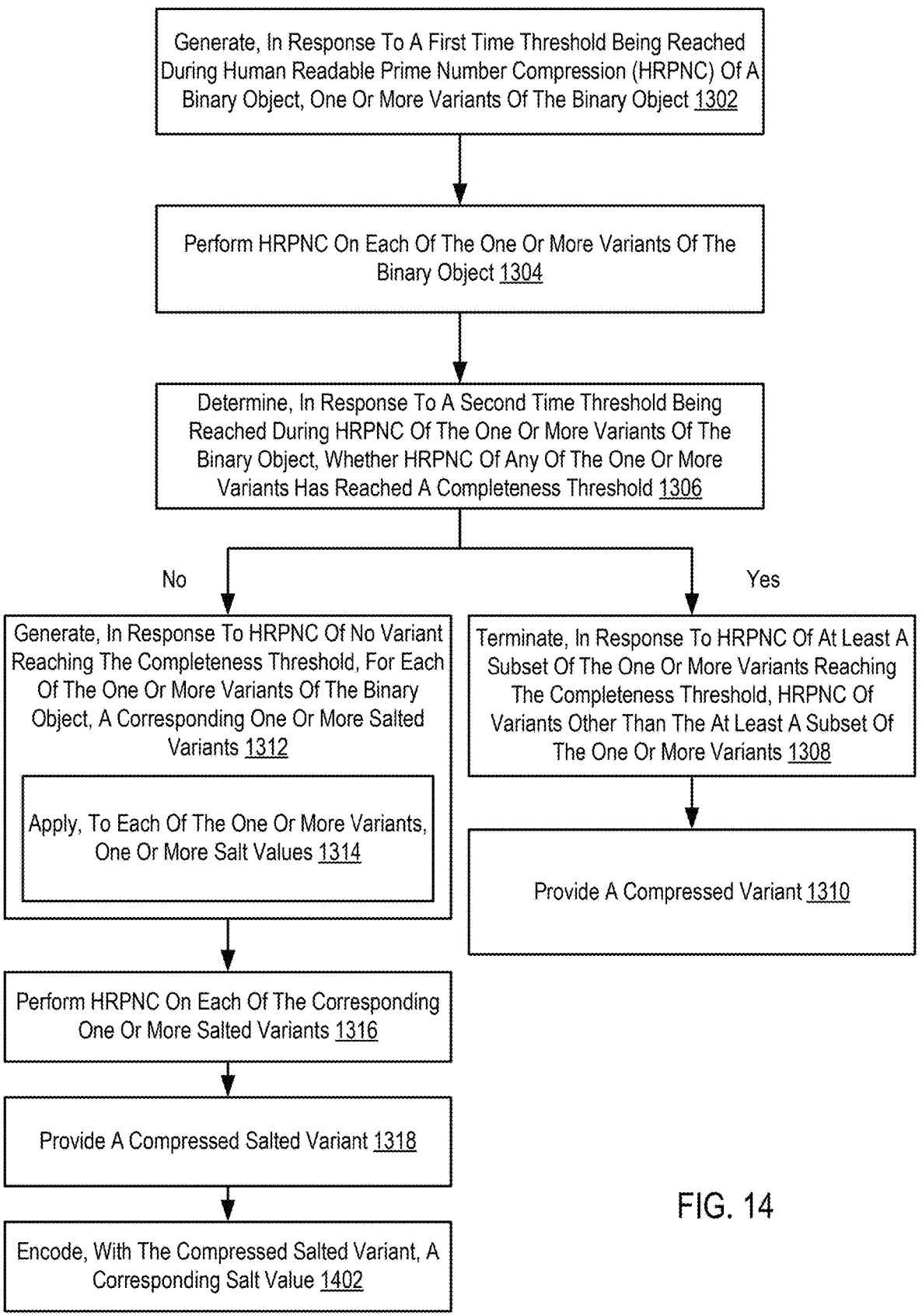
FIG. 14 sets forth a flowchart of another example method of HRPNC for binary variations in accordance with some embodiments of the present disclosure.

For further explanation, FIG. 14 sets forth a flowchart of another example method of HRPNC for binary variations in accordance with some embodiments of the present disclosure. The method of FIG. 14 is similar to FIG. 13 in that the method of FIG. 14 also includes: generating 1302, in response to a first time threshold being reached during human readable prime number compression (HRPNC) of a binary object, one or more variants of the binary object; performing 1304 HRPNC on each of the one or more variants of the binary object; determining 1306, in response to a second time threshold being reached during HRPNC of the one or more variants of the binary object, whether HRPNC of any of the one or more variants has reached a completeness threshold; terminating 1308, in response to HRPNC of at least a subset of the one or more variants reaching the completeness threshold, HRPNC of variants other than the at least a subset of the one or more variants; providing 1310 a compressed variant; generating, in response to HRPNC of no variant reaching the completeness threshold, for each of the one or more variants of the binary object, a corresponding one or more salted variants; performing 1316 HRPNC on each of the corresponding one or more salted variants; and providing 1318 a compressed salted variant.

The method of FIG. 14 differs from FIG. 13 in that the method of FIG. 14 also includes encoding 1402, with the compressed salted variant (e.g., of the first HRPNC to complete), a corresponding salt value. Encoding the corresponding salt value with the compressed salted variant may be performed according to similar approaches as are set forth above. For example, in some embodiments, the corresponding salt value may be encoded (e.g., appended or otherwise inserted) with the compressed salted variant in the same string. In some embodiments, the corresponding salt value may be separated from the compressed salted variant or other data encode with the compressed salted variant using a delimiter. In some embodiments, the corresponding salt value may be encoded as a numerical value. In some embodiments, the corresponding salt value may be encoded as an HRPNC string by applying HRPNC to the corresponding salt value.

Figure 15:
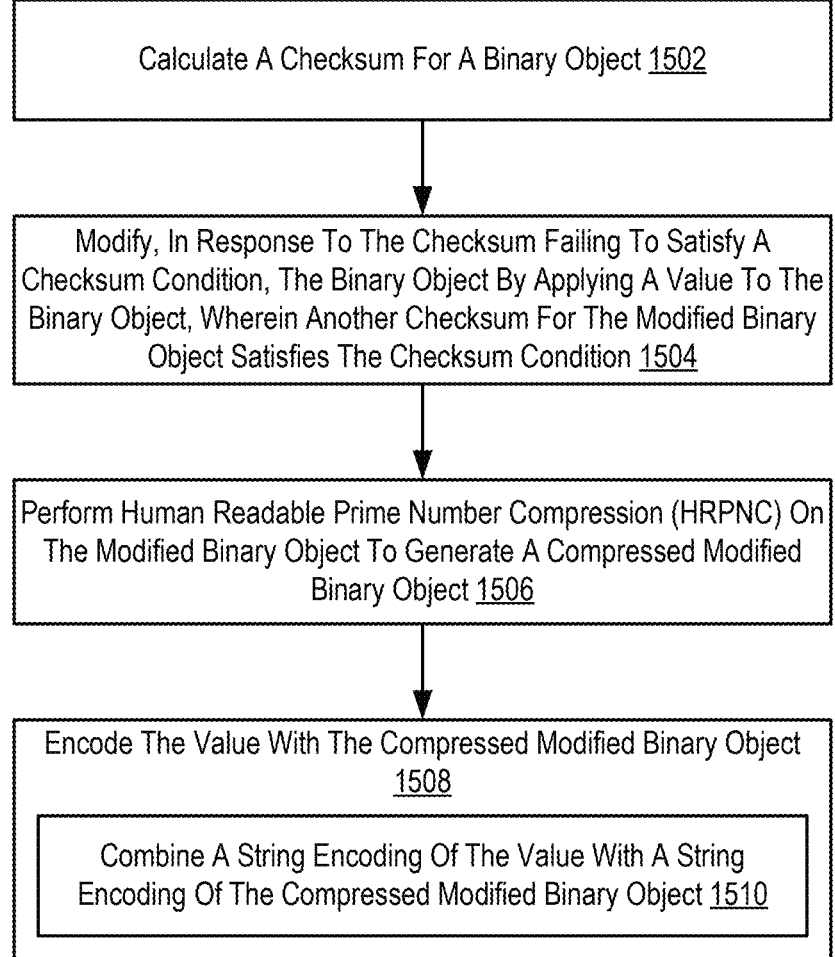
FIG. 15 sets forth a flowchart of an example method of enforced checksums for HRPNC in accordance with some embodiments of the present disclosure.

For further explanation, FIG. 15 sets forth a flowchart of an example method of enforced checksums for HRPNC in accordance with some embodiments of the present disclosure. The method of FIG. 15 includes calculating 1502 a checksum for a binary object. Calculating 1502 the checksum for the binary object may be performed according to any approach for calculating checksums as would be understood by one skilled in the art. Particularly, the checksum algorithm used may be configured such that changes to the underlying data result in predictable changes to the checksum so that, as will be described in further detail below, the binary object can be modified such that its checksum as modified equals some desired value.

The method of FIG. 15 also includes modifying 1504, in response to the checksum failing to satisfy a checksum condition, the binary object by applying a value to the binary object, wherein another checksum for the modified binary object satisfies the checksum condition. In some embodiments, the calculated 1502 checksum is compared to one or more checksum conditions (e.g., criteria for checksums). If the checksum fails to satisfy the checksum condition, a value is calculated that, when applied to the binary object, causes the checksum of the modified binary object to satisfy the checksum condition.

The particular checksum condition(s) used may vary according to particular design or engineering considerations. For example, in some embodiments, the checksum condition may include the checksum equaling some fixed or predefined value. As another example, in some embodiments, the checksum condition may include the checksum being a factor or power of some value. In some embodiments, the checksum condition may include other rules or criteria for values as can be appreciated.

Applying the value to the binary object may include using any mathematical or logical operation as can be appreciated. Readers will appreciate that the particular approaches for calculating this value and the particular operation used in applying this value may vary according to various considerations, including the particular checksum algorithm and checksum condition used. The method of FIG. 15 also includes performing 1506 HRPNC on the modified binary object to generate a compressed modified binary object. Performing 1506 HRPNC on the modified binary object may include any of the approaches for HRPNC set forth herein.

The method of FIG. 15 also includes encoding 1508 the value with the compressed modified binary object. Encoding 1508 the value with the compressed modified binary object serves to indicate, to a recipient of the compressed modified binary object, how the binary object was modified prior to HRPNC, thereby allowing this recipient to reverse application of the value after decompressing the compressed modified binary object and generate the original binary object. In some embodiments, encoding 1508 the value with the compressed modified binary object may include combining 1510 a string encoding of the value with a string encoding of the compressed modified binary object. As an example, a string encoding of the value may be appended to the string encoding of the compressed modified binary object. In some embodiments, the string encoding of the value may be separated from the string encoding of the compressed modified binary object and/or other encoded values using a delimiter. In some embodiments, the delimiter may include an operation identifier for applying the value. For example, the delimiter may include an operation identifier indicating the particular mathematical or logical operation used when applying the value to the binary object. As another example, the delimiter may include an operation identifier indicating a mathematical or logical operation for reversing application of the value to the modified binary object so as to generate the binary object.

In some embodiments, the delimiter may include a checksum order identifier indicating when to apply a checksum function. For example, in some embodiments, the checksum order identifier may indicate (e.g., to a recipient of the compressed modified binary object) that a checksum function should be applied after decompression. Thus, if a recipient of compressed data wishes to verify that the checksum of the received data satisfies the checksum condition, the compressed data should be decompressed before calculating the checksum. As will be described in further detail below, in some embodiments, checksums may be calculated based on HRPNC strings (e.g., the output of applying HRPNC). Accordingly, in some embodiments, the checksum order identifier may indicate that the checksum of the received data should be applied before decompression (e.g., to the HRPNC string encoding). Here, in embodiments where the delimiter includes a checksum order identifier, the checksum order identifier would indicate that the checksum function should be applied after decompression to the modified binary object.

For further explanation, FIG. 16 sets forth a flowchart of another example method of enforced checksums for HRPNC in accordance with some embodiments of the present disclosure. The method of FIG. 16 is similar to FIG. 15 in that the method of FIG. 16 also includes calculating 1502 a checksum for a binary object; modifying 1504, in response to the checksum failing to satisfy a checksum condition, the binary object by applying a value to the binary object, wherein another checksum for the modified binary object satisfies the checksum condition; performing 1506 HRPNC on the modified binary object to generate a compressed modified binary object; and encoding 1508 the value with the compressed modified binary object, including combining 1510 a string encoding of the value with a string encoding of the compressed modified binary object.

The method of FIG. 16 differs from FIG. 15 in that the method of FIG. 16 also includes decompressing 1602 the compressed modified binary object to generate the modified binary object. Decompressing 1602 the compressed modified binary object may be performed by a recipient of the compressed modified binary object. For example, the recipient may receive the encoding of the compressed modified binary object as well as the value applied to the binary object to generate the modified binary object as described above. Decompressing 1602 the compressed modified binary object may include for decompressing HRPNC data as are set forth herein.

The method of FIG. 16 also includes validating 1604 the other checksum of the modified binary object. In some embodiments, validating 1604 the other checksum of the modified binary object includes calculating, after decompression, the checksum of the modified binary object and validating that this other checksum satisfies the checksum condition. As the binary object was modified to cause the resulting checksum to satisfy the checksum condition, the other checksum should validate successfully. The method of FIG. 16 also includes reversing 1606 application of the value to the modified binary object to generate the binary object. In other words, an inverse of the operation used to modify the binary object is applied to the modified binary object so as to generate the binary object.

For further explanation, FIG. 17 sets forth a flowchart of an example method of enforced checksums for HRPNC in accordance with some embodiments of the present disclosure. The method of FIG. 17 includes performing 1702 HRPNC on a binary object to generate a compressed binary object. Performing 1702 HRPNC on the binary object may include similar approaches for performing HRPNC as are described herein. The method of FIG. 17 also includes calculating 1704 a checksum for the compressed binary object. Here, the checksum is calculated after HRPNC has been performed. In other words, the checksum is calculated as a function of the HRPNC string encoding of the binary object. The particular checksum algorithm used may vary according to design or engineering considerations.

The method of FIG. 17 also includes calculating 1706, in response to the checksum failing to satisfy a checksum condition, a value that, when applied to the checksum, causes an adjusted checksum for the compressed binary object to satisfy the checksum condition. The checksum condition may include similar checksum conditions as described above. In the example method of FIG. 17, rather than apply a value to the underlying data from which the checksum is generated to induce a particular checksum value satisfying the checksum condition, the value is a value that, when applied to the checksum itself (e.g., thereby generating an adjusted checksum), causes the adjusted checksum to satisfy the checksum condition.

As an example, assume that the checksum condition is that the checksum equals a predefined value. Should the checksum of the compressed binary object not equal this predefined value, a value may be calculated 1706 as the difference between the checksum and the predefined value. When applying this calculated value (e.g., by adding or subtracting this calculated value from the checksum), the adjusted checksum will equal the predefined value. As another example, assume that the checksum condition is that the checksum equals a power of two. Should the checksum of the compressed binary object not equal a power of two, a value may be calculated 1706 as the difference between the checksum and the nearest power of two. When applying this calculated value (e.g., by adding or subtracting this calculated value from the checksum), the adjusted checksum will equal a power of two.

The method of FIG. 17 also includes encoding 1708 the value with the compressed binary object. Encoding 1708 the value with the compressed binary object serves to indicate, to a recipient of the compressed binary object, how a checksum for the compressed binary object should be adjusted or modified so as to satisfy the checksum condition. In some embodiments, encoding 1708 the value with the compressed binary object may include combining 1710 a string encoding of the value with a string encoding of the compressed binary object. As an example, a string encoding of the value may be appended to the string encoding of the compressed binary object. In some embodiments, the string encoding of the value may be separated from the string encoding of the compressed binary object and/or other encoded values using a delimiter. In some embodiments, the delimiter may include an operation identifier for applying the value. For example, the delimiter may include an operation identifier indicating the particular mathematical or logical operation used when applying the value to the checksum of the compressed binary object. As is set forth above, in some embodiments, the delimiter may include a checksum order identifier indicating when to apply a checksum function. Here, the checksum order identifier would indicate that the checksum function should be applied before decompression to the compressed binary object.

For further explanation, FIG. 18 sets forth a flowchart of another example method of enforced checksums for HRPNC in accordance with some embodiments of the present disclosure. The method of FIG. 18 is similar to FIG. 17 in that the method of FIG. 18 also includes: performing 1702 HRPNC on a binary object to generate a compressed binary object; calculating 1704 a checksum for the compressed binary object; calculating 1706, in response to the checksum failing to satisfy a checksum condition, a value that, when applied to the checksum, causes an adjusted checksum for the compressed binary object to satisfy the checksum condition; and encoding 1708 the value with the compressed binary object, including combining 1710 a string encoding of the value with a string encoding of the compressed binary object.

The method of FIG. 18 differs from FIG. 17 in that the method of FIG. 18 also includes validating 1802 the adjusted checksum of the compressed binary object by applying the value encoded with the compressed binary object to the checksum of the compressed binary object. In other words, a checksum is calculated as a function of the compressed binary object. The value encoded with the compressed binary object is then applied to this checksum to generate an adjusted checksum. For example, the value may be applied according to an operation identifier used as a delimiter or otherwise encoded with the value and the compressed binary object. This adjusted checksum is then validated 1802 to confirm that the adjusted checksum satisfies the checksum condition. The method of FIG. 18 also includes decompressing 1804 the compressed binary object to generate the binary object. Decompressing 1804 the compressed binary object may include similar approaches for decompressing data compressed using HRPNC as set forth herein. In some embodiments, decompressing 1804 the compressed binary object may be performed in response to validating 1802 the adjusted checksum.

Figure 19:
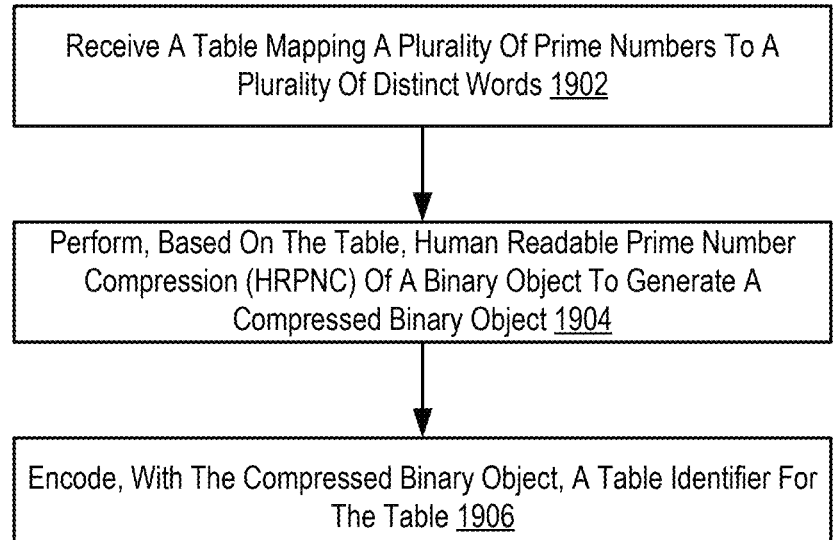
FIG. 19 sets forth a flowchart of an example method of conversion tables as a service for HRPNC in accordance with some embodiments of the present disclosure.

For further explanation, FIG. 19 sets forth a flowchart for conversion tables as a service for HRPNC in accordance with some embodiments of the present disclosure. The method of FIG. 19 includes receiving 1902 a table mapping a plurality of prime numbers to a plurality of distinct words. As is set forth above, a table or other data structure may associate prime numbers with corresponding words for use in HRPNC. In some embodiments, the table may be received from a remotely disposed computing device implementing a service for generating and/or providing tables for use in HRPNC, thereby providing these tables as a service. In some embodiments, a table identifier may be received with the table. By varying the tables used in HRPNC, data security is improved as the same table may not be usable in decompressing HRPNC strings.

The method of FIG. 19 includes performing 1904, based on the table, HRPNC of a binary object to generate a compressed binary object. Here, rather than some predefined or pre-generated table, a remotely received table is used to perform HRPNC. In some embodiments, the entity from which the table is received, or some other remotely disposed entity, may dynamically generate the table and associate the table with the table identifier for later use, described in further detail below. In some embodiments, the table may include a range of time numbers mapped to a dynamically generated selection of words. For example, in some embodiments, the table may map prime numbers to a randomly selected set of words. As another example, in some embodiments, the table may include a randomized reordering of some other table. Continuing with this example, assume a base table that maps an ordered range of prime numbers to an ordered set of three-letter words. Here, the words in the mapping may be randomly rearranged such that at least some of the prime numbers are mapped to different words.

In some embodiments, the table may map prime numbers to a human readable sentence. As an example, in some embodiments, the prime factorization of the binary object may be calculated before receiving the table. The prime factorization may be included in a request for a table. Here, a table may be generated that maps each distinct prime factor to a word such that the compressed binary object includes a human readable sentence (e.g., aside from any indications of a number of occurrences of each distinct prime factor). The remaining entries in the table (e.g., prime numbers other than the prime factors of the binary object) may then be mapped to a random arrangement of words, an ordered selection of the remaining unmapped words, and the like.

The method of FIG. 19 also includes encoding 1906, with the compressed binary object, a table identifier for the table. The table identifier may be encoded added or appended to the compressed binary object as separated by some delimiter. In some embodiments, the table identifier may include a numerical identifier, one or more words, or another unique identifier for the table as can be appreciated. By encoding 1906 the table identifier with the compressed binary object, a recipient may request the table used to compress the compressed binary object so as to decompress it.

Figure 20:
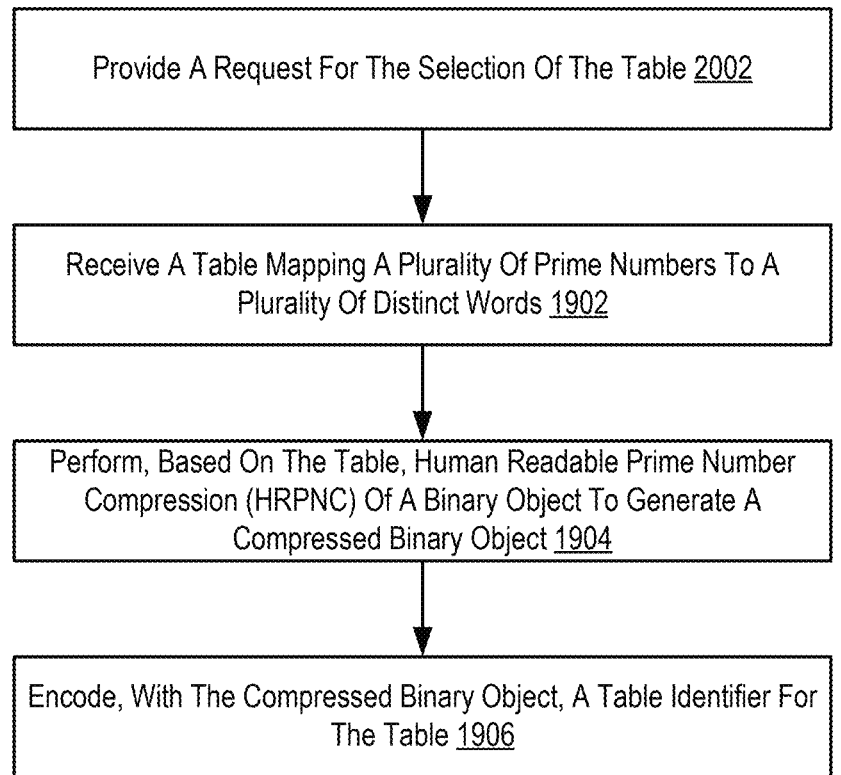
FIG. 20 sets forth a flowchart of another example method of conversion tables as a service for HRPNC in accordance with some embodiments of the present disclosure.

For further explanation, FIG. 20 sets forth a flowchart of another example method for conversion tables as a service for HRPNC in accordance with some embodiments of the present disclosure. The method of FIG. 20 is similar to FIG. 19 as the method of FIG. 20 also includes: receiving 1902 a table mapping a plurality of prime numbers to a plurality of distinct words; performing 1904, based on the table, human readable prime number compression (HRPNC) of a binary object to generate a compressed binary object; and encoding 1906, with the compressed binary object, a table identifier for the table.

The method of FIG. 20 also includes providing 2002 a request for the table, wherein the table is received in response to the request. In some embodiments, the request may include one or more conditions or criteria for dynamically generating the table. Accordingly, the received table may be generated based on these conditions or criteria. In some embodiments, the request may include a table identifier or other selection of a particular table. For example, in some embodiments, a selection of multiple tables may be presented to or otherwise made available to a user. A user may then indicate, in the request, a particular table to be received for use.

As is set forth above, in some embodiments, the request may be sent and the table received after calculating the prime factorization of the binary object. Here, the prime factorization may be included in the request such that a table mapping the prime factorization to a human readable sentence may be generated. After receiving the table, the prime factorization can be mapped so as to generate the compressed binary object.

For further explanation, FIG. 21 sets forth a flowchart of another example method for conversion tables as a service for HRPNC in accordance with some embodiments of the present disclosure. The method of FIG. 21 is similar to FIG. 19 as the method of FIG. 21 also includes: receiving 1902 a table mapping a plurality of prime numbers to a plurality of distinct words; performing 1904, based on the table, human readable prime number compression (HRPNC) of a binary object to generate a compressed binary object; and encoding 1906, with the compressed binary object, a table identifier for the table.

The differing steps performed in FIG. 21 may be performed by some other entity than the entity that initially received the table and generated the compressed binary object as described above. For example, the steps of FIG. 21 may be performed by a recipient of the compressed binary object so as to decompress the compressed binary object into the binary object. The method of FIG. 21 differs from FIG. 19 in that the method of FIG. 21 also includes providing 2102 a request for the table, wherein the request comprises the table identifier. The request for the table may be provided to the service or entity that generated or provided the table as described above. The request includes the table identifier so as to determine which table to provide in response to the request. In some embodiments, access controls may require authentication in order to request the identified table. Accordingly, in some embodiments, the request may include one or more authentication credentials.

The method of FIG. 21 also includes receiving 2104 the table (e.g., in response to the request). In embodiments where the request included one or more authentication credentials, receiving 2104 the table may be performed in response to a successful authentication of the authentication credentials. The method of FIG. 21 also includes decompressing 2106 the compressed binary object using the table to generate the binary object. Decompressing 2106 the compressed binary object may be performed using similar approaches as are set forth above, instead using a remotely received table to map the words encoded into the compressed binary object to their corresponding prime factors.

Figure 22:
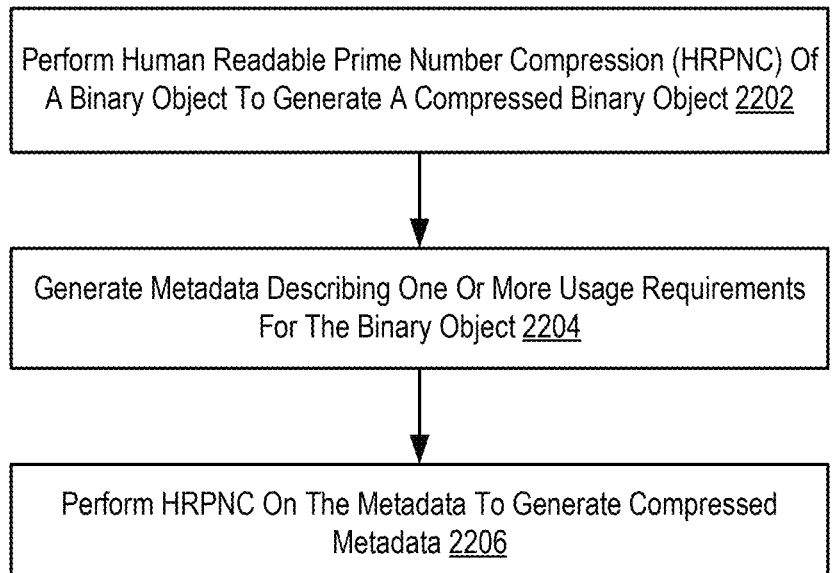
FIG. 22 sets forth a flowchart of an example method of generating HRPNC metadata for usage requirements in accordance with some embodiments of the present disclosure.

For further explanation, FIG. 22 sets forth a flowchart of an example method of generating HRPNC metadata for usage requirements in accordance with some embodiments of the present disclosure. The method of FIG. 22 includes performing 2202 HRPNC of a binary object to generate a compressed binary object. Performing 2202 HRPNC of the binary object may include any of the approaches set forth herein for HRPNC.

The method of FIG. 22 also includes generating 2204 metadata describing one or more usage requirements for the binary object. The metadata may be encoding using any encoding scheme or format as can be appreciated. The one or more usage requirements may include hardware and/or resource requirements associated with the binary object. For example, in some embodiments, the one or more usage requirements may include a size of the binary object. In this example, the size of the binary object is a usage requirement of the binary object in that a system attempting to decompress the compressed binary object to generate the binary object must have an amount of free storage space equal to or exceeding the size of the binary object.

In some embodiments, the one or more usage requirements may include one or more hardware requirements to decompress the compressed binary object. For example, in some embodiments, a system may have minimum hardware specifications or particular hardware components in order to decompress the compressed binary object or to decompress the compressed binary object within particular time or resource usage constraints. In some embodiments, the one or more usage requirements may include one or more hardware requirements to execute the binary object. These hardware requirements may include minimum system specifications or required hardware components for decompressing the HRPNC of executing some software or application encoded by the binary object. The one or more usage requirements may also include other conditions as can be appreciated.

The method of FIG. 22 also includes performing 2206 HRPNC on the metadata to generate compressed metadata. Performing 2206 HRPNC on the metadata may include any of the approaches for HRPNC as are set forth herein. In some embodiments, the table mapping prime numbers to words used in performing 2206 HRPNC on the metadata may be different than the table used in performing 2202 HRPNC on the binary object. For example, each of these tables may not include overlapping words (e.g., no word in one table is found in the other table). As another example, in some embodiments, each table may use words of different lengths or differing according to other criteria.

The approaches set forth herein provide for metadata that describes the usage requirements for a binary object compressed using HRPNC. This allows for the metadata to be referenced in order to determine if a compressed binary object can be decompressed and/or if the binary object can be executed, saving on resources that may otherwise be used should a given system be unable to satisfy the usage requirements in the metadata. Moreover, as the metadata itself is also compressed using HRPNC, it can be transmitted or otherwise provided with the compressed binary object using similar approaches and channels. For example, the compressed metadata may be provided to a recipient as a string, payload, or transmission separate from the compressed binary object or, as will be described in further detail below, the compressed binary object and the compressed metadata may be encoded together.

Figure 23:
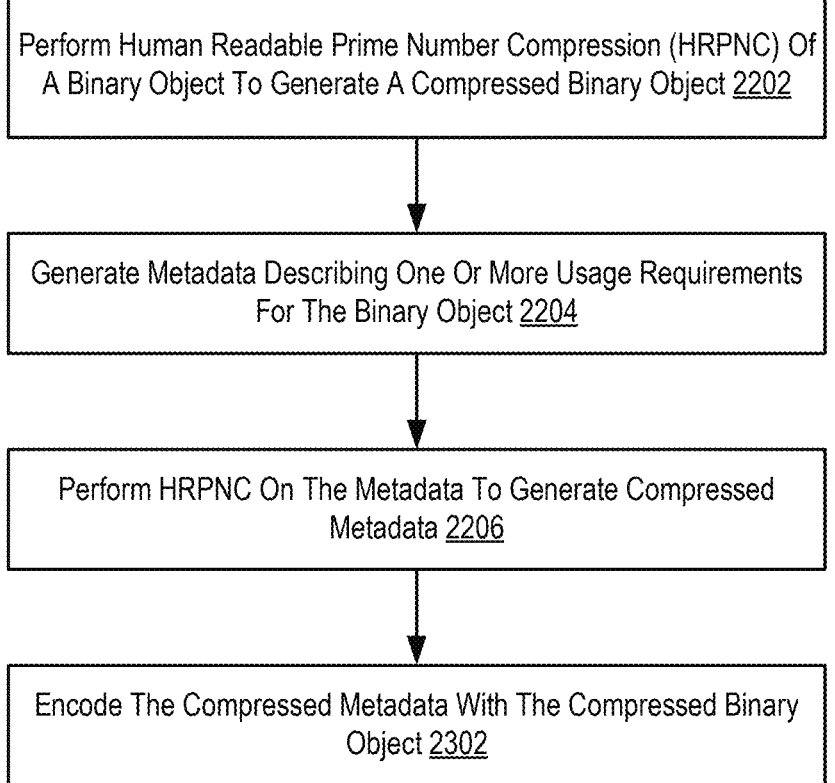
FIG. 23 sets forth a flowchart of another example method of generating HRPNC metadata for usage requirements in accordance with some embodiments of the present disclosure.

For further explanation FIG. 23 sets forth another flowchart for generating HRPNC metadata for usage requirements in accordance with some embodiments of the present disclosure. The method of FIG. 23 is similar to FIG. 22 in that the method of FIG. 23 also includes performing 2202 HRPNC of a binary object to generate a compressed binary object; generating 2204 metadata describing one or more usage requirements for the binary object; and performing 2206 HRPNC on the metadata to generate compressed metadata.

The method of FIG. 23 differs from FIG. 22 in that the method of FIG. 23 also includes encoding 2302 the compressed metadata with the compressed binary object. For example, the compressed metadata and the compressed binary object may be encoded into a same string by appending or otherwise adding the compressed metadata to the compressed binary object. In some embodiments, the compressed metadata may be separated from the compressed binary object or other data in the string encoding using a delimiter. Thus, the compressed binary object and the compressed metadata may be transmitted or otherwise provided to a recipient in the same data payload or transmission.

For further explanation, FIG. 24 sets forth a flowchart of an example method of decompressing HRPNC objects using metadata in accordance with some embodiments of the present disclosure. The method of FIG. 24 includes receiving 2402 a compressed binary object and compressed metadata, wherein the compressed binary object comprises a HRPNC of a binary object and wherein the compressed metadata comprises a HRPNC of metadata associated with the binary object. For example, the compressed metadata may describe one or more usage requirements of the binary object as described above.

In some embodiments, the compressed metadata and the compressed binary object may be received 2402 together (e.g., in the same string encoding, in the same transmission). Accordingly, in some embodiments, receiving 2402 the compressed binary object and the compressed metadata may include receiving 2404 a single string encoding the compressed binary object and the compressed metadata. In some embodiments, the compressed metadata and the compressed binary object may be received 2402 separately (e.g., in different string encodings, in different transmissions). Accordingly, in some embodiments, receiving 2402 the compressed binary object and the compressed metadata may include receiving 2406 separate strings each encoding the compressed binary object or the compressed metadata.

The method of FIG. 24 also includes decompressing 2408 the compressed metadata to generate the metadata. In some embodiments, where the compressed metadata is received with the compressed binary object, the compressed metadata may be extracted or identified from a string encoding of both the compressed metadata and the compressed binary object by identifying a delimiter or using other parsing techniques. Decompressing 2408 the compressed metadata may be performed according to any of the approaches set forth herein for decompressing data that has been compressed using HRPNC.

The method of FIG. 24 also includes determining 2410, based on the metadata, whether one or more usage requirements indicated in the metadata are satisfied. For example, where the metadata indicates a size of the binary object, determining 2410 whether the one or more usage requirements indicated in the metadata are satisfied may include determining if there is an amount of free storage space meeting or exceeding the size of the binary object. As another example, where the metadata indicates particular hardware requirements, determining 2410 whether the one or more usage requirements indicated in the metadata are satisfied may include determining whether these hardware requirements are satisfied.

In some embodiments, it may also be determined whether usage requirements not explicitly indicated in the metadata are satisfied. Such usage requirements may be implicit or based on some other usage requirements indicated in the metadata. For example, such usage requirements may include time constraints to decompress the compressed binary object, estimated battery usage in decompressing the compressed binary object, and the like. In this example, the time and/or battery required to decompress the binary object may be calculated or estimated on a size of the binary object, current resource usage, and the like.

If the one or more usage requirements are not satisfied, the method of FIG. 24 advances to generating 2412 a notification. In some embodiments, the notification may indicate that the compressed binary object cannot or will not be decompressed. In some embodiments, the notification may indicate which usage requirements were not satisfied. In some embodiments, the notification may indicate remedial actions that may allow these usage requirements to be satisfied (e.g., freeing some amount of storage space, terminating other processes to free up resources, and the like). In some embodiments, the notification may solicit a confirmation from the user as to whether to decompress the compressed binary object. For example, a user may wish to decompress the compressed binary object even though the user system fails to meet the hardware requirements to execute the binary object.

If the one or more usage requirements are satisfied, the method of FIG. 24 advances to decompressing 2414 the compressed binary object to generate the binary object. Decompressing 2414 the compressed binary object to generate the binary object may be performed according to similar approaches as are set forth herein for decompressing data compressed using HRPNC.

For further explanation, FIG. 25 sets forth a flowchart of an example method of decompressing HRPNC objects using metadata in accordance with some embodiments of the present disclosure. The method of FIG. 25 is similar to FIG. 24 in that the method of FIG. 25 also includes receiving 2402 a compressed binary object and compressed metadata, wherein the compressed binary object comprises a HRPNC of a binary object and wherein the compressed metadata comprises a HRPNC of metadata associated with the binary object, including: receiving 2404 a single string encoding the compressed binary object and the compressed metadata; or receiving 2406 separate strings each encoding the compressed binary object or the compressed metadata; decompressing 2408 the compressed metadata to generate the metadata; and determining 2410, based on the metadata, whether one or more usage requirements for the binary object indicated in the metadata are satisfied; and generating 2412 a notification in response to the one or more usage requirements not being met; or decompressing 2414 the compressed binary object to generate the compressed binary object in response to the one or more usage requirements for the binary object being satisfied.

The method of FIG. 25 differs from FIG. 24 in that the method of FIG. 25 also includes generating 2502 a notification describing resource utilization associated with decompression of the compressed binary object. The notification may describe, for example, an amount of storage space used before and/or after decompression, an amount of storage space used by the binary object, a time to decompress the compressed binary object, an amount of processing resources used in decompressing the compressed binary object, or more information as can be appreciated.

For further explanation, FIG. 26 sets forth a flowchart of an example method of pattern matching for HRPNC in accordance with some embodiments of the present disclosure. The method of FIG. 26 includes identifying 2602, in a binary object, one or more portions of the binary object matching one or more patterns. In some embodiments, the one or more patterns may include one or more defined sequences of bits in the binary object and/or one or more portions of the bits of the binary object that match particular conditions or rules. Particularly, in some embodiments, the one or more patterns may correspond to patterns or sequences of bits that, in isolation, may be computationally simple to compress using HRPNC or that may be matched to predefined HRPNC encodings so as to accelerate the overall HRPNC process applied to the binary object.

As an example, the one or more patterns may include a power of two such that a matching portion of the binary object may include a binary encoding of a power of two. As another example, the one or more patterns may include prime numbers in a set of prime numbers and/or factors of prime numbers in a set of prime numbers. Continuing with this example, the set of prime numbers may include a set of prime numbers mapped to words as described above in order to perform HRPNC. Other patterns are also contemplated within the scope of the present disclosure.

After identifying 2602 the one or more portions of the binary object matching the one or more patterns, the binary object may be logically subdivided into those portions of the binary object that matched the one or more patterns and potentially one or more other portions that did not match a pattern. Various approaches may be used for searching or analyzing subcomponents (e.g., portions) of the binary object to determine if they match some pattern. Readers will appreciate that, in some embodiments, the binary object may be repeatedly or iteratively searched in order to find particular portions that match patterns. As an example, in some embodiments, the binary object may be searched to identify the largest patterns first (e.g., the largest powers of two, the largest prime numbers or factors thereof), and then iteratively search the binary object for progressively smaller patterns.

In some embodiments, searching the binary object for portions that match the one or more patterns may result in identifying portions that may partially overlap with other portions. Accordingly, in some embodiments, identifying 2602 the one or more portions may include identifying, from multiple identified portions, a non-overlapping subset of portions as the identified 2602 one or more portions. As an example, in some embodiments, the binary object may be searched such that the final identified 2602 set of portions includes the fewest number of portions that don't match some pattern, the fewest bits that don't match some pattern (e.g., that aren't included in some portion of the finally identified 2602 set of portions), and the like. In some embodiments, when searching the binary object, a portion matching some pattern may be removed from consideration and excluded from further searching of the binary object so as to prevent identifying overlapping portions.

The method of FIG. 26 also includes performing 2604 HRPNC on each portion of the one or more portions to generate one or more compressed portions. In other words, HRPNC is applied to each of the one or more portions individually so as to generate a corresponding one or more compressed portions, with each of the one or more compressed portions including a string encoding of HRPNC compressed data. Embodiments where the binary object includes some other portions not matching the one or more patterns will be described in further detail below.

The method of FIG. 26 also includes generating 2606, for the binary object, a compressed binary object comprising a concatenation of the one or more compressed portions. In other words, rather than including an encoding of HRPNC applied to the binary object as a whole, the compressed binary object instead includes one or more HRPNC string encodings for different subcomponents (e.g., portions) of the binary object combined together. In some embodiments, each of the one or more compressed portions may be included in the compressed binary object in an order in which their respective portions are present in the binary object. In some embodiments, each of the one or more compressed portions may be separated by some delimiter or otherwise identified in the compressed binary object. As an example, assume a given binary object having five portions A, B, C, D, and E matching some pattern and no bits that did not match this pattern. In this example, the compressed binary object may be expressed as "$hrpnc(A)+$hrpnc(B)+$hrpnc(C)+$hrpnc(D)+$hrpnc(E)," with "+" serving as a delimiter and $hrpnc(input) being the HRPNC encoding of the input portion.

In order to decompress a compressed binary object encoded as described above, each of the compressed portions included in the compressed binary object will be individually decompressed using similar approaches as are set forth above. This will result in the respective portions of the binary object identified in 2602 as having matched the one or more patterns. These portions may then be combined (e.g., concatenated) in the appropriate order so as to regenerate the binary object.

Readers will appreciate that the greatest amount of computational complexity and resource usage in HRPNC is in calculating the prime factorization of the binary object to be compressed. The approaches described herein allow for the binary object to be subdivided into portions having reduced computational complexity when applying HRPNC, reducing the computational complexity and resource usage compared to applying HRPNC to the binary object in its totality. As an example, for a portion of the binary object matching a factor of a prime number, the prime factorization for that portion would include the prime number multiplied by the prime factorization of that factor. Accordingly, in order to perform HRPNC on that portion, only a prime factorization for that factor need be calculated. Calculating the prime factorizations for the factors of the matching portions is considerably less computationally complex compared to calculating the prime factorization for the binary object as a whole.

For further explanation, FIG. 27 sets forth a flowchart of another example method for pattern matching for HRPNC in accordance with some embodiments of the present disclosure. The method of FIG. 27 is similar to FIG. 26 in that the method of FIG. 27 also includes identifying 2602, in a binary object, one or more portions of the binary object matching one or more patterns; performing 2604 HRPNC on each portion of the one or more portions to generate one or more compressed portions; and generating 2606, for the binary object, a compressed binary object comprising a concatenation of the one or more compressed portions.

The method of FIG. 27 differs from FIG. 26 in that the method of FIG. 27 also includes performing 2702 HRPNC on one or more remaining portions of the binary object not matching the one or more patterns to generate one or more compressed remaining portions, wherein the compressed binary object further comprises a concatenation of the one or more compressed remaining portions. As is set forth above, in some embodiments, not all of the binary object will be included in the identified 2602 portions that match the one or more patterns. In such embodiments, these remaining portions will each be compressed using HRPNC so as to generate one or more compressed remaining portions.

The compressed remaining portions will also be included as substrings of the compressed binary object. For example, the compressed portions and compressed remaining portions may be concatenated in the order in which they occur in the binary object. Continuing with the example above with a binary object having five portions A, B, C, D, and E matching some pattern, further assume that the binary object also includes remaining portions X, Y, and Z, with remaining portion X being found at the beginning of the binary object, Y between portions B and C, and Z at the end of the binary object. This results in a binary object having, in order, portions and remaining portions X, A, B, Y, C, D, E, Z. In this example, the compressed binary object may be expressed as "hrpnc(X)+$hrpnc(A)+$hrpnc(B)+hrpnc(Y)+$hrpnc(C)+$hrpnc(D)+$hrpnc(E)+hrpnc(Z)."

The approaches set forth herein allow for portions of the binary object not matching some pattern to also be separately compressed using HRPNC for inclusion in the compressed binary object. Although these remaining portions may not benefit from the computational advantages of matching some pattern, their reduced size relative to the binary object as a whole provides for a reduced computational complexity when undergoing HRPNC. In other words, the total computational complexity required for individually performing HRPNC on the portions matching and not matching patterns may still be reduced when compared to performing HRPNC on the binary object in its totality.

For further explanation, FIG. 28 sets forth a flowchart of another example method for pattern matching for HRPNC in accordance with some embodiments of the present disclosure. The method of FIG. 28 is similar to FIG. 26 in that the method of FIG. 28 also includes identifying 2602, in a binary object, one or more portions of the binary object matching one or more patterns; performing 2604 HRPNC on each portion of the one or more portions to generate one or more compressed portions; and generating 2606, for the binary object, a compressed binary object comprising a concatenation of the one or more compressed portions.

The method of FIG. 28 differs from FIG. 26 in that identifying 2602, in a binary object, one or more portions of the binary object matching one or more patterns also includes initializing 2802 a counter. As will be described below, the counter value will serve as a factor applied to a prime number when determining if that factor of that prime number is found in the binary object. Here, a counter will be initialized such that, when the counter is decremented, each factor of the prime number up to and including the highest counter value is considered for pattern matching. The initial counter value may be calculated according to various approaches. As an example, in some embodiments, the initial counter value n may be calculated by dividing the binary object (e.g., a numerical representation of the binary object) by the highest prime number in a table used to perform HRPNC. If these numbers divide evenly (e.g., without a remainder), HRPNC may be performed on the binary object without further pattern matching as the prime factorization for the binary object will be n multiplied by this highest prime number. Otherwise, the counter can be set as the whole number portion of n (e.g., without the remainder).

The method of FIG. 28 also includes for each value of the counter, until a termination condition is satisfied, determining 2804, for each prime number in an enumeration of prime numbers, whether the binary object includes a portion matching a given value of the counter multiplied by a corresponding prime number. In other words, until some termination condition is satisfied, described below, each combination of counter values and prime numbers are searched in the binary object. For example, assuming an initial counter value, the set of prime numbers in the table is iterated through (e.g., in reverse order) to determine if the current counter value multiplied by the current prime number is found in the binary object. After iterating through the set of prime numbers, the counter value may be decremented and the set of prime numbers iterated through again.

If a match is found, that matching portion is compressed using HRPNC (e.g., by virtue of being identified 2602 as matching a pattern). That portion may then be removed from consideration when further searching through the binary object. Iterating through prime numbers and counter values will continue until the counter value reaches zero or until the entirety of the binary object has been identified as being included in some portion matching some pattern. Should the counter value reach zero, any portions of the binary object not identified as matching some pattern will be treated as remaining portions of the binary object as described above.

Figure 29:
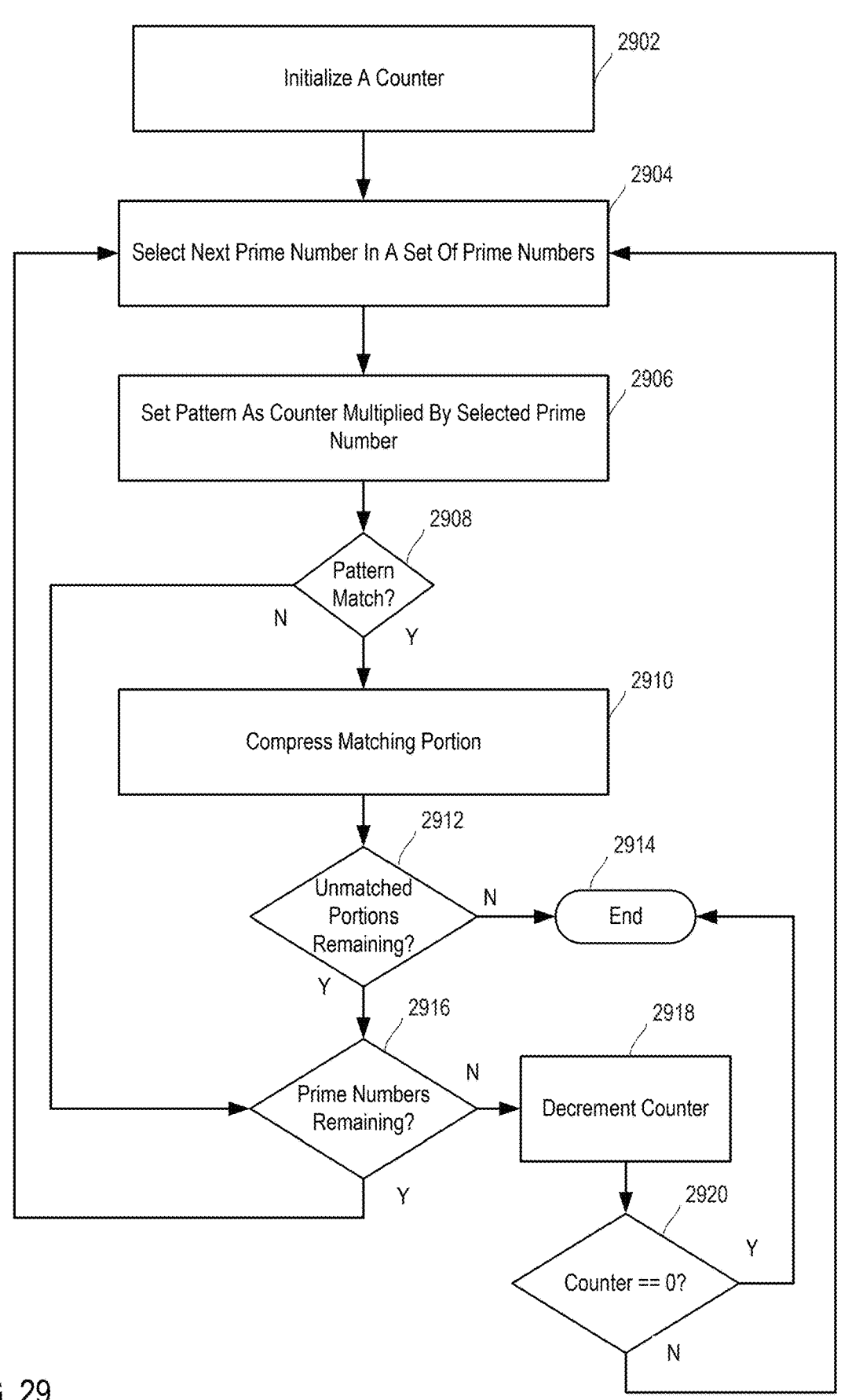
FIG. 29 sets forth a flowchart of another example method of pattern matching for HRPNC in accordance with some embodiments of the present disclosure.

The approaches set forth in FIG. 28 may be further explained using the flowchart of FIG. 29. Beginning at step 2902, a counter is initialized. The counter may be initialized using similar approaches as are described above, such as by dividing the binary object by the highest prime number in a set of prime numbers mapped by HRPNC. In this example, it is assumed that the binary object did not divide evenly by this highest prime number. At step 2904 the next prime number in a set of prime numbers is selected. Should no prime number be currently selected, indicating the first iteration of this flowchart, or should the lowest prime number in the set be selected, indicating that a new iteration of is starting with a new counter value, the highest prime number in the set may be selected. Otherwise, the next lowest prime number is selected.

At step 2906 the pattern to be searched for in the binary object is set as the counter multiplied by the selected prime number. At step 2908, if there is a match to this pattern, the process advances to step 2910 where this matching portion is compressed and removed from further search. At step

2912, it is determined if there are any unmatched portions remaining. In other words, it is determined if any remaining portion of the binary object has yet to be matched to a pattern. If not, indicating that the entirety of the binary object has been matched with some pattern, the process advances to step 2914 and ends. Otherwise, the process advances to step 2916 where it is determined if any prime numbers are remaining in the set to be multiplied with the current counter value. If so, the process returns to step 2904 where the next prime number is selected. If not, indicating that the current prime number is the lowest prime number in the set, the process advances to step 2918 where the counter is decremented.

At step 2920 it is determined if the counter is equal to zero. If so, indicating that all combinations of prime numbers and counter values have been searched for in the binary object, the process advances to step 2914 and ends. Otherwise, the process returns to step 2904 where the next prime number is selected. Turning back to step 2908, if no match for the pattern was found, the process advances to step 2916 where it is determined if any prime numbers remain.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
generating a plurality of variants of a binary object;
performing human readable prime number compression (HRPNC) of each variant of the binary object;
identifying a first HRPNC to complete; and
providing a compressed variant of the first HRPNC to complete.

2. The method of claim 1, further comprising terminating, in response to identifying the first HRPNC to complete, any incomplete HRPNC of each variant of the binary object.

3. The method of claim 1, wherein generating the plurality of variants of the binary object comprises adding one or more files to data encoded by the binary object.

4. The method of claim 1, wherein generating the plurality of variants of the binary object comprises renaming one or more files of data encoded by the binary object.

5. The method of claim 1, wherein generating the plurality of variants of the binary object comprises generating one or more comment variants for source code encoded by the binary object.

6. The method of claim 1, wherein generating the plurality of variants of the binary object comprises repeatedly compiling source code using different compiler options.

7. The method of claim 1, wherein HRPNC of each variant of the binary object is performed at least partially in parallel.

8. The method of claim 1, further comprising generating one or more instructions to undo a variation associated with the compressed variant.

9. The method of claim 1, further comprising generating a notification indicating the first HRPNC to complete.

10. The method of claim 1, wherein generating the plurality of variants is facilitated by at least one generative artificial intelligence (AI) model.

11. An apparatus comprising:
a processing device; and
memory operatively coupled to the processing device, wherein the memory stores computer program instructions that, when executed, cause the processing device to:
generate a plurality of variants of a binary object;
perform human readable prime number compression (HRPNC) of each variant of the binary object;
identify a first HRPNC to complete; and
provide a compressed variant of the first HRPNC to complete.

12. The apparatus of claim 11, wherein the computer program instructions, when executed, further cause the processing device to terminate, in response to identifying the first HRPNC to complete, any incomplete HRPNC of each variant of the binary object.

13. The apparatus of claim 11, wherein, to generate the plurality of variants of the binary object, the computer program instructions, when executed, cause the processing device to add one or more files to data encoded by the binary object.

14. The apparatus of claim 11, wherein, to generate the plurality of variants of the binary object, the computer program instructions, when executed, cause the processing device to rename one or more files of data encoded by the binary object.

15. The apparatus of claim 11, wherein, to generate the plurality of variants of the binary object, the computer program instructions, when executed, cause the processing device to generate one or more comment variants for source code encoded by the binary object.

16. The apparatus of claim 11, wherein, to generate the plurality of variants of the binary object, the computer program instructions, when executed, cause the processing device to repeatedly compile source code using different compiler options.

17. The apparatus of claim 11, wherein HRPNC of each variant of the binary object is performed at least partially in parallel.

18. The apparatus of claim 11, wherein the computer program instructions, when executed, further cause the processing device to generate one or more instructions to undo a variation associated with the compressed variant.

19. The apparatus of claim 11, wherein the computer program instructions, when executed, further cause the processing device to generate a notification indicating the first HRPNC to complete.

20. A computer program product comprising a computer readable storage medium, wherein the computer readable storage medium comprises computer program instructions that, when executed:
generate a plurality of variants of a binary object;
perform human readable prime number compression (HRPNC) of each variant of the binary object;
identify a first HRPNC to complete; and
provide a compressed variant of the first HRPNC to complete.

* * * * *